United States Patent
Obata et al.

(10) Patent No.: US 10,084,134 B2
(45) Date of Patent: *Sep. 25, 2018

(54) METHOD FOR STRETCHING VAPOR DEPOSITION MASK, METHOD FOR PRODUCING FRAME-EQUIPPED VAPOR DEPOSITION MASK, METHOD FOR PRODUCING ORGANIC SEMICONDUCTOR ELEMENT, AND STRETCHING APPARATUS

(71) Applicant: Dai Nippon Printing Co., Ltd., Tokyo (JP)

(72) Inventors: Katsunari Obata, Tokyo (JP); Hideyuki Okamoto, Tokyo (JP); Yoshiyuki Honma, Tokyo (JP); Toshihiko Takeda, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/598,694

(22) Filed: May 18, 2017

(65) Prior Publication Data
US 2017/0256713 A1   Sep. 7, 2017

Related U.S. Application Data

(63) Continuation of application No. 15/126,651, filed as application No. PCT/JP2015/059875 on Mar. 30, 2015, now Pat. No. 9,705,083.

(30) Foreign Application Priority Data

Mar. 31, 2014 (JP) .................................. 2014-074863
Mar. 27, 2015 (JP) .................................. 2015-067153

(51) Int. Cl.
*H01L 51/00* (2006.01)
*B05D 1/32* (2006.01)
(Continued)

(52) U.S. Cl.
CPC .......... *H01L 51/0011* (2013.01); *B05B 12/24* (2018.02); *B05B 15/0456* (2013.01);
(Continued)

(58) Field of Classification Search
CPC . H01L 51/0011; H01L 51/56; H01L 51/5012; B05B 15/0456; B05D 1/32
See application file for complete search history.

(56) References Cited

U.S. PATENT DOCUMENTS

2004/0020435 A1* 2/2004 Tsuchiya ............... C23C 14/042
118/723 VE
2005/0166842 A1* 8/2005 Sakamoto ............. C23C 14/042
118/721
(Continued)

FOREIGN PATENT DOCUMENTS

JP   2003-332057 A1   11/2003
JP   2007-169716 A1   7/2007
(Continued)

OTHER PUBLICATIONS

International Search Report and Written Opinion (Application No. PCT/JP2015/059875) dated Jun. 16, 2015.

*Primary Examiner* — Benjamin Sandvik
*Assistant Examiner* — Farid Khan
(74) *Attorney, Agent, or Firm* — Burr & Brown, PLLC

(57) ABSTRACT

In a method for stretching a vapor deposition mask including a metal mask in which a slit is formed and a resin mask in which an opening corresponding to a pattern to be produced by vapor deposition is formed at a position overlapping with the slit, a stretching assistance member is overlapped on one surface of the vapor deposition mask, the stretching assistance member is fixed to the vapor deposition mask in at least part of a portion in which the one surface of the vapor deposition mask and the stretching assistance member overlap with each other, and the vapor deposition mask fixed to (Continued)

the stretching assistance member is stretched by pulling the stretching assistance member fixed to the vapor deposition mask.

20 Claims, 17 Drawing Sheets

(51) Int. Cl.
    *B05B 15/04*     (2006.01)
    *H01L 51/56*     (2006.01)
    *B05B 12/24*     (2018.01)
    *H01L 51/50*     (2006.01)

(52) U.S. Cl.
    CPC ................ *B05D 1/32* (2013.01); *H01L 51/56* (2013.01); *H01L 51/5012* (2013.01)

(56) References Cited

U.S. PATENT DOCUMENTS

| | | | |
|---|---|---|---|
| 2012/0282445 A1* | 11/2012 | Kim | C23C 14/042 428/209 |
| 2014/0347903 A1* | 11/2014 | Ritchey | H02P 25/18 363/126 |
| 2014/0377903 A1 | 12/2014 | Takeda et al. | |
| 2015/0037928 A1* | 2/2015 | Hirobe | C23C 14/042 438/99 |

FOREIGN PATENT DOCUMENTS

| | | |
|---|---|---|
| JP | 2007-257839 A1 | 10/2007 |
| JP | 2010-196091 A1 | 9/2010 |
| JP | 2012-233253 A1 | 11/2012 |
| JP | 5288072 B2 | 9/2013 |
| JP | 2013-245392 A1 | 12/2013 |

* cited by examiner

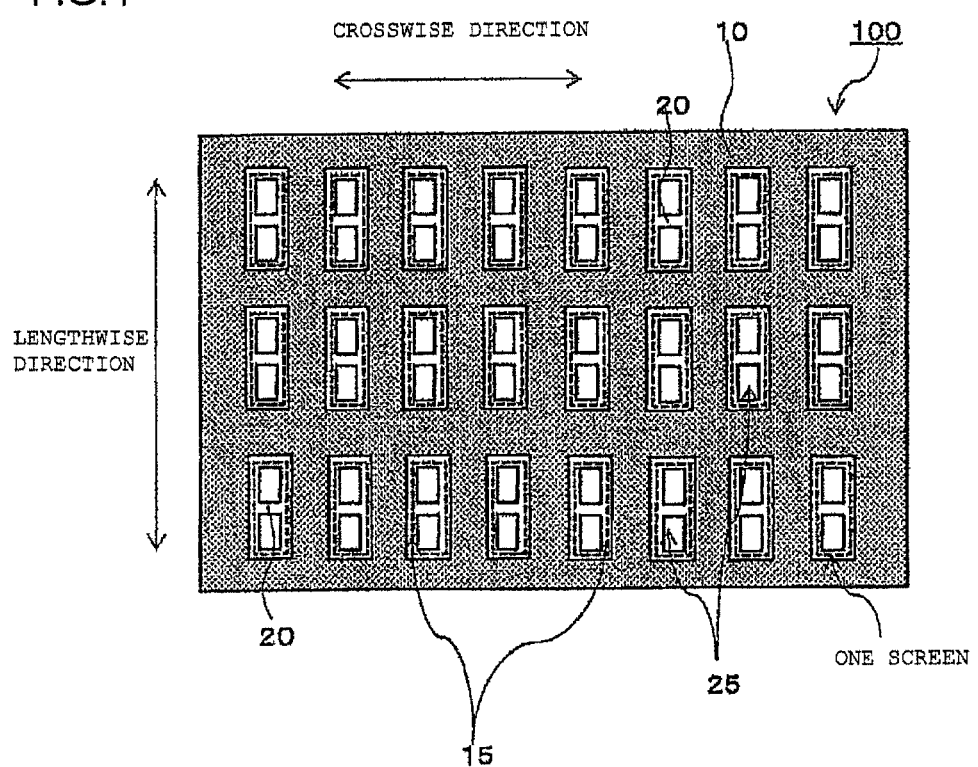

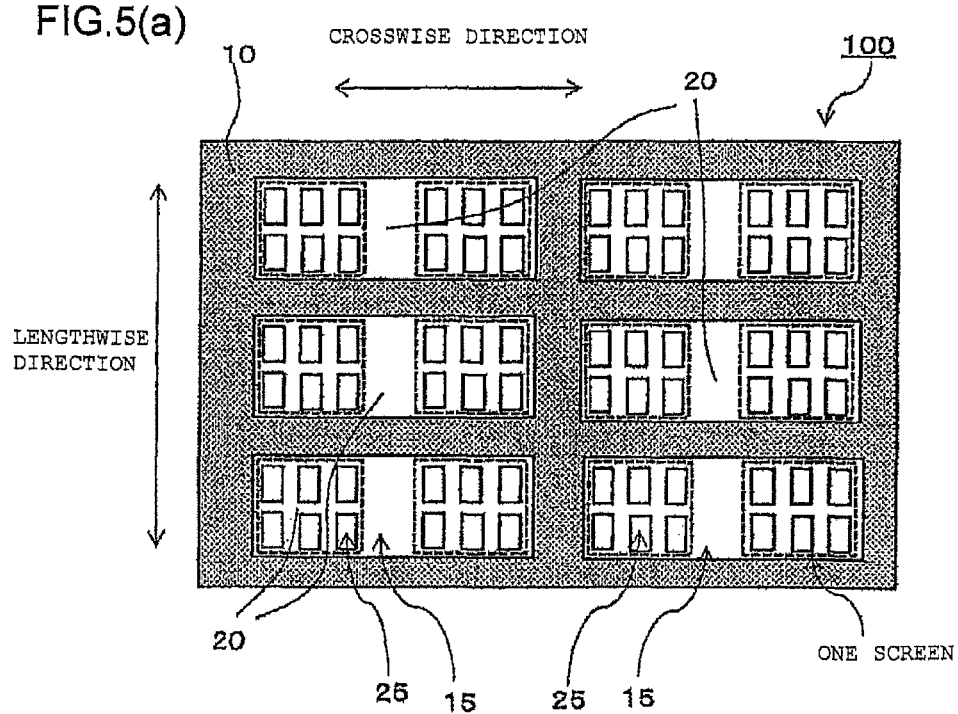
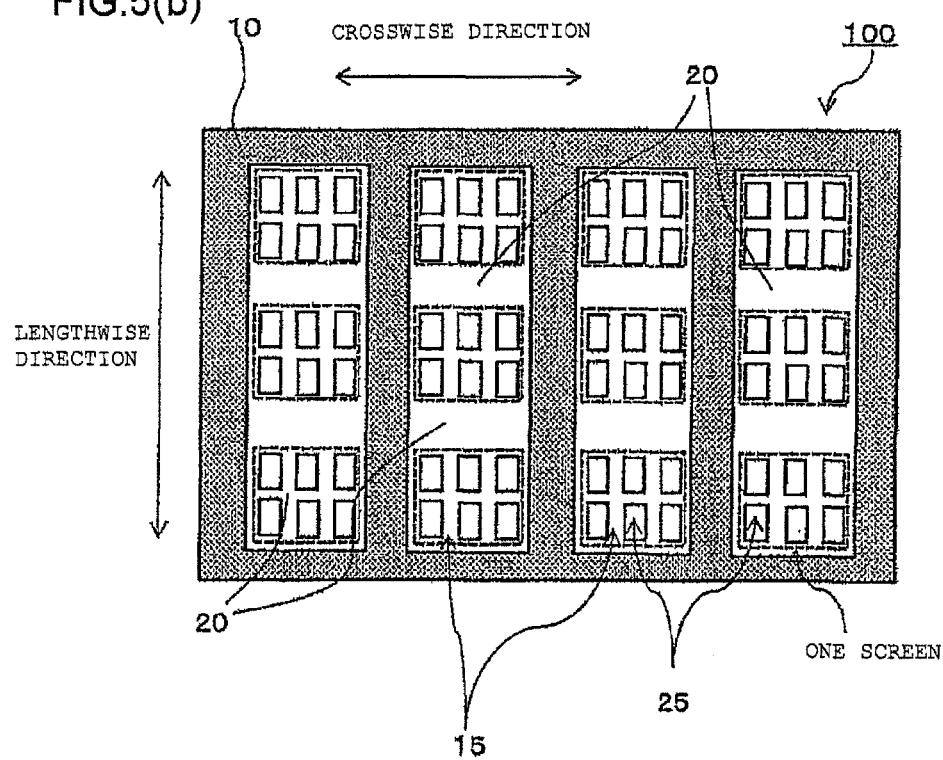

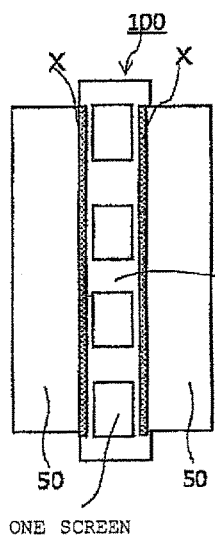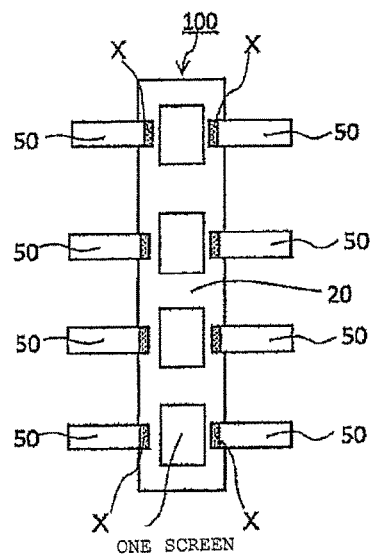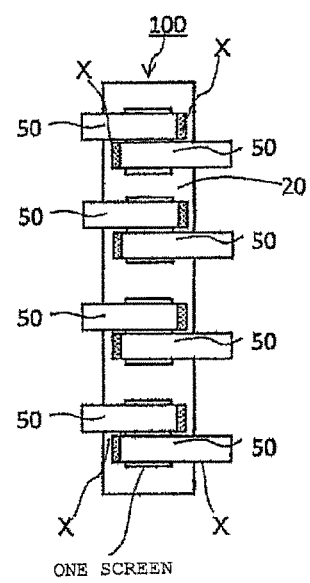

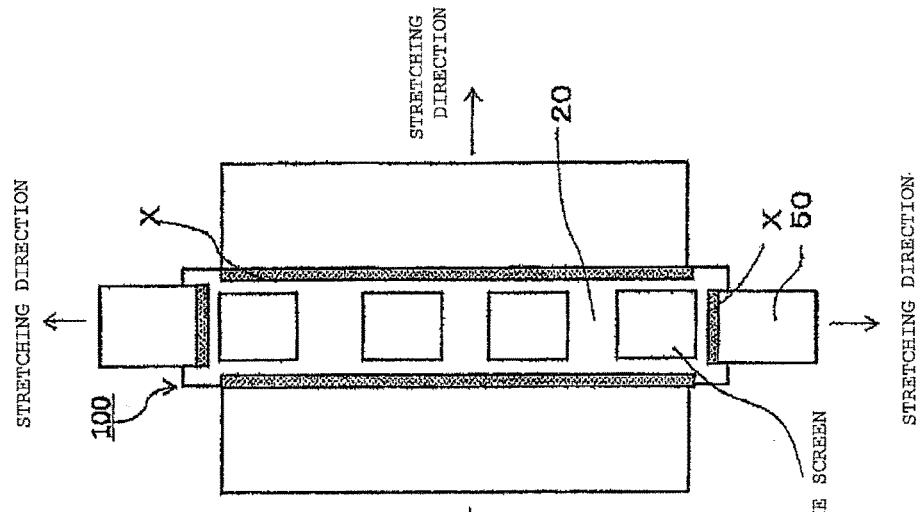
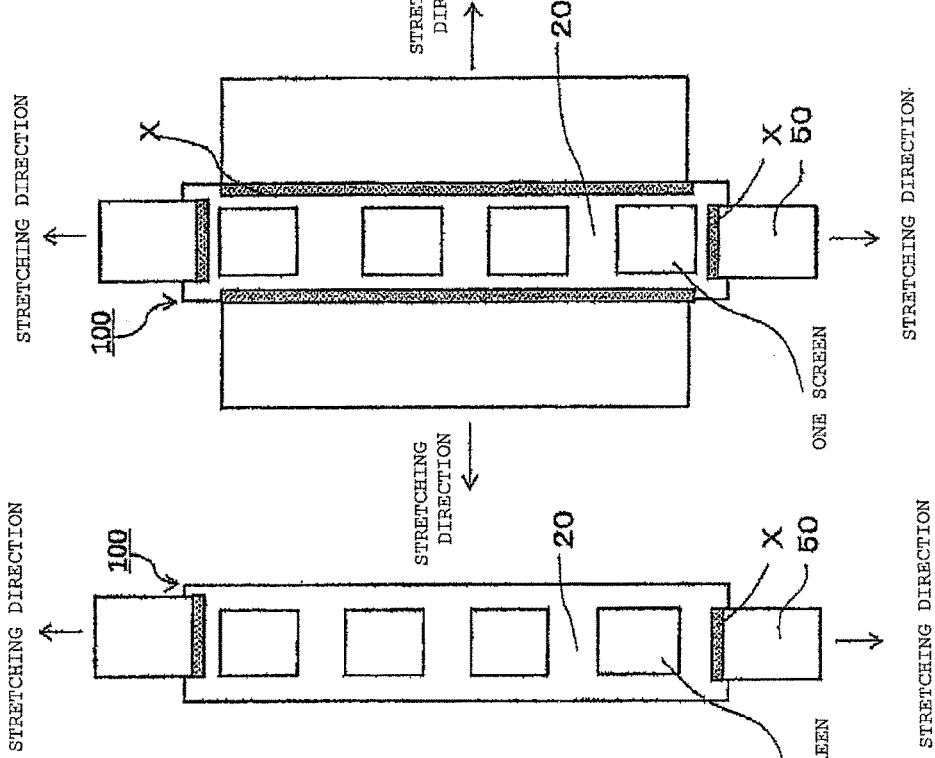
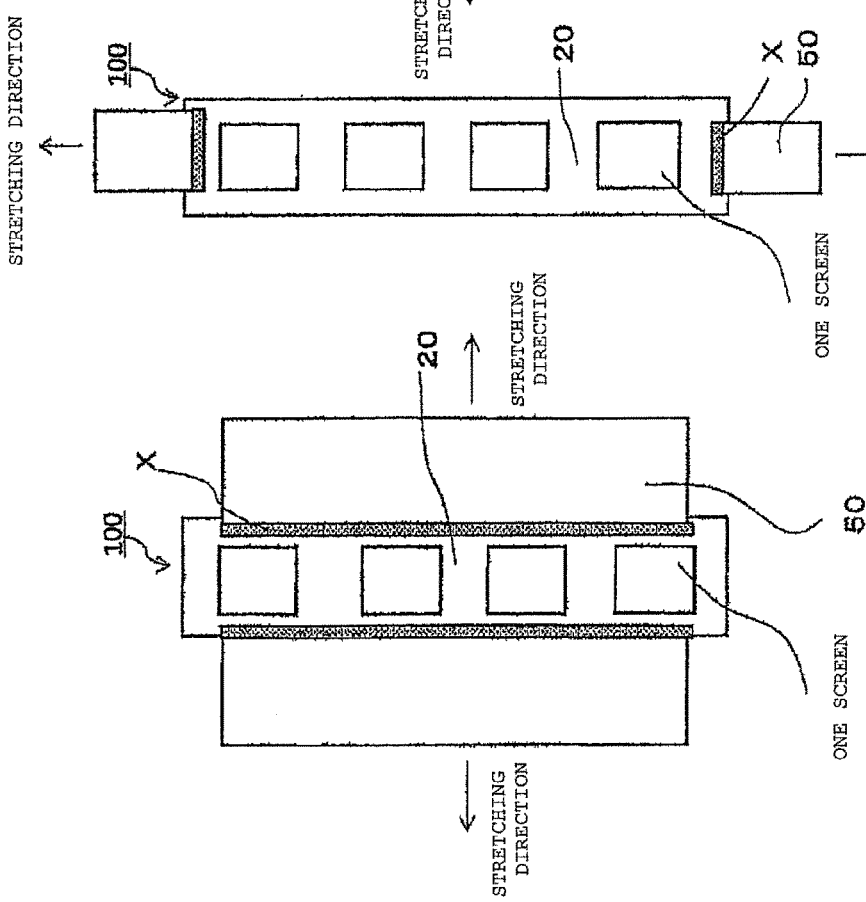

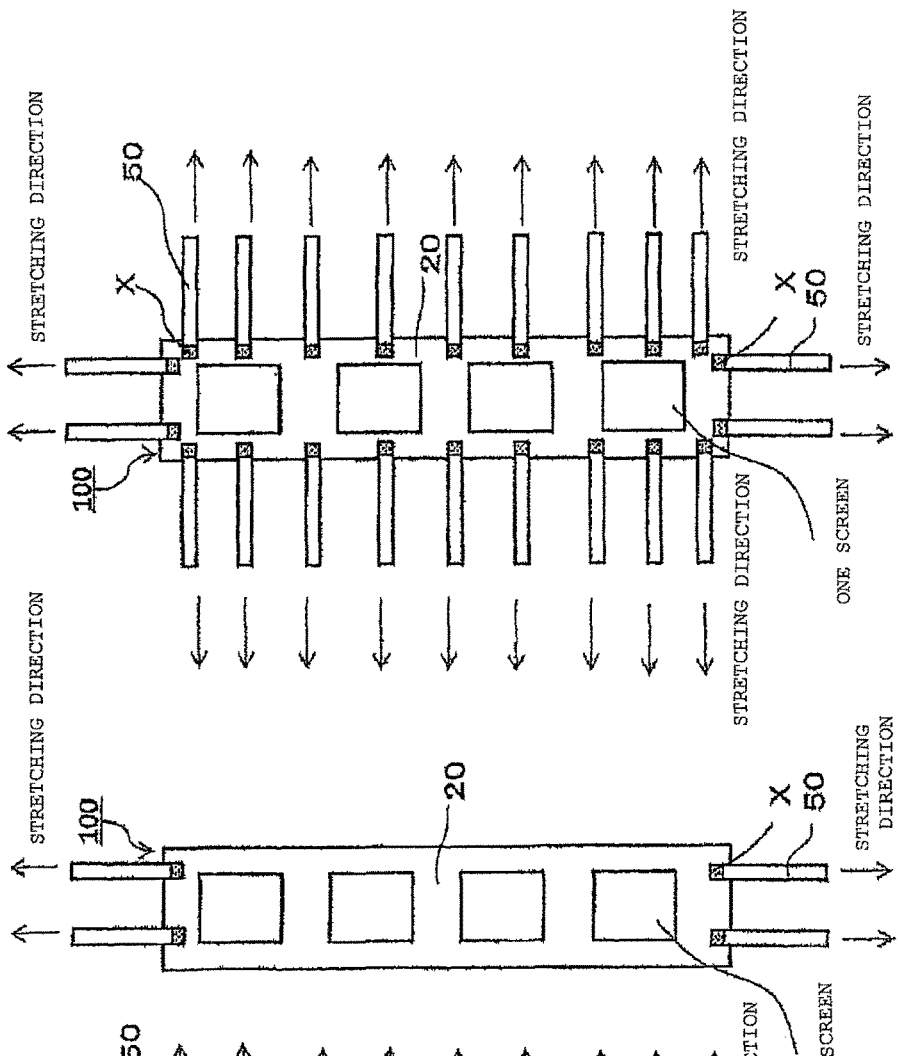

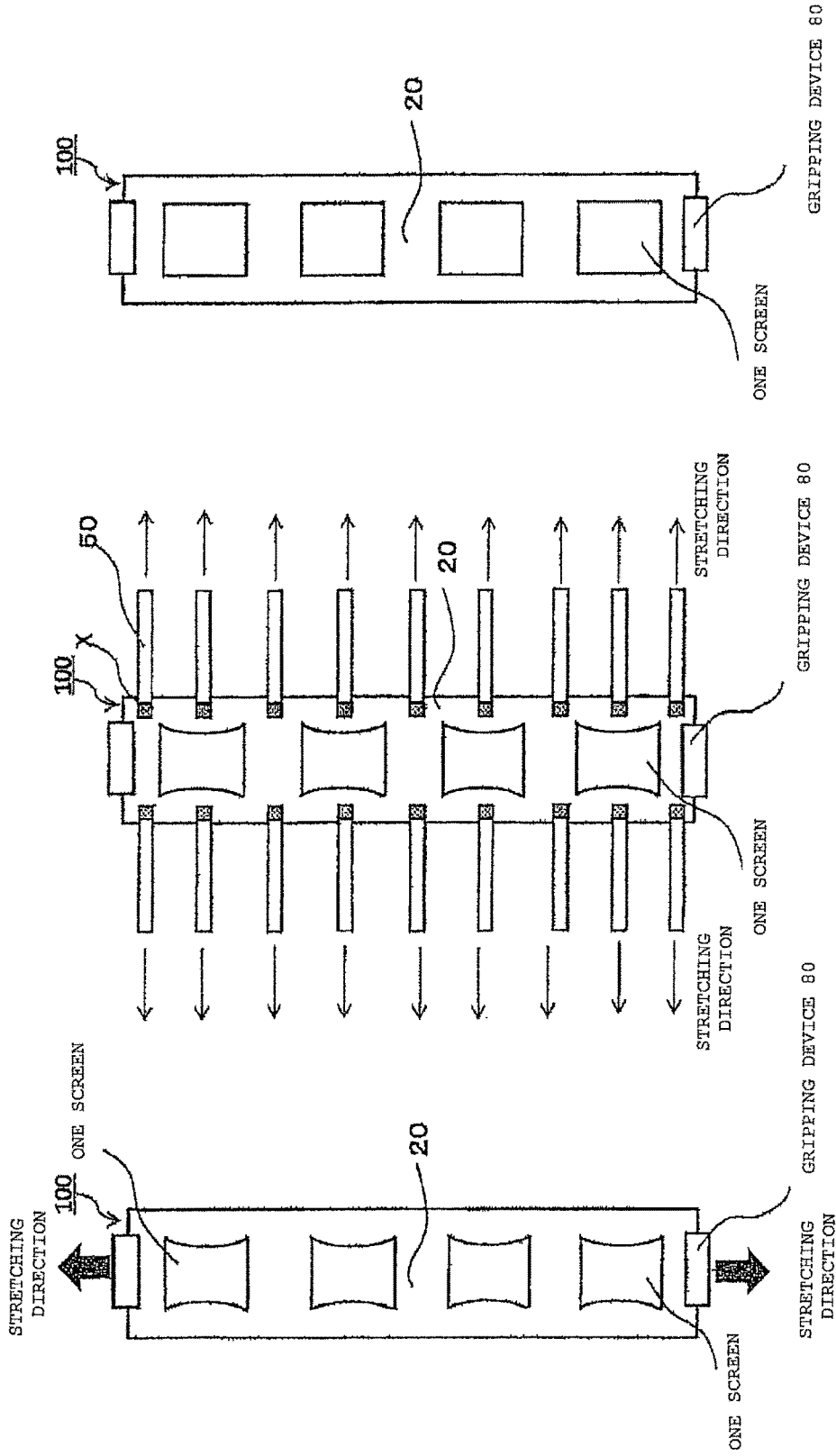

VIEW SEEN FROM RESIN MASK SIDE

VIEW SEEN FROM RESIN MASK SIDE

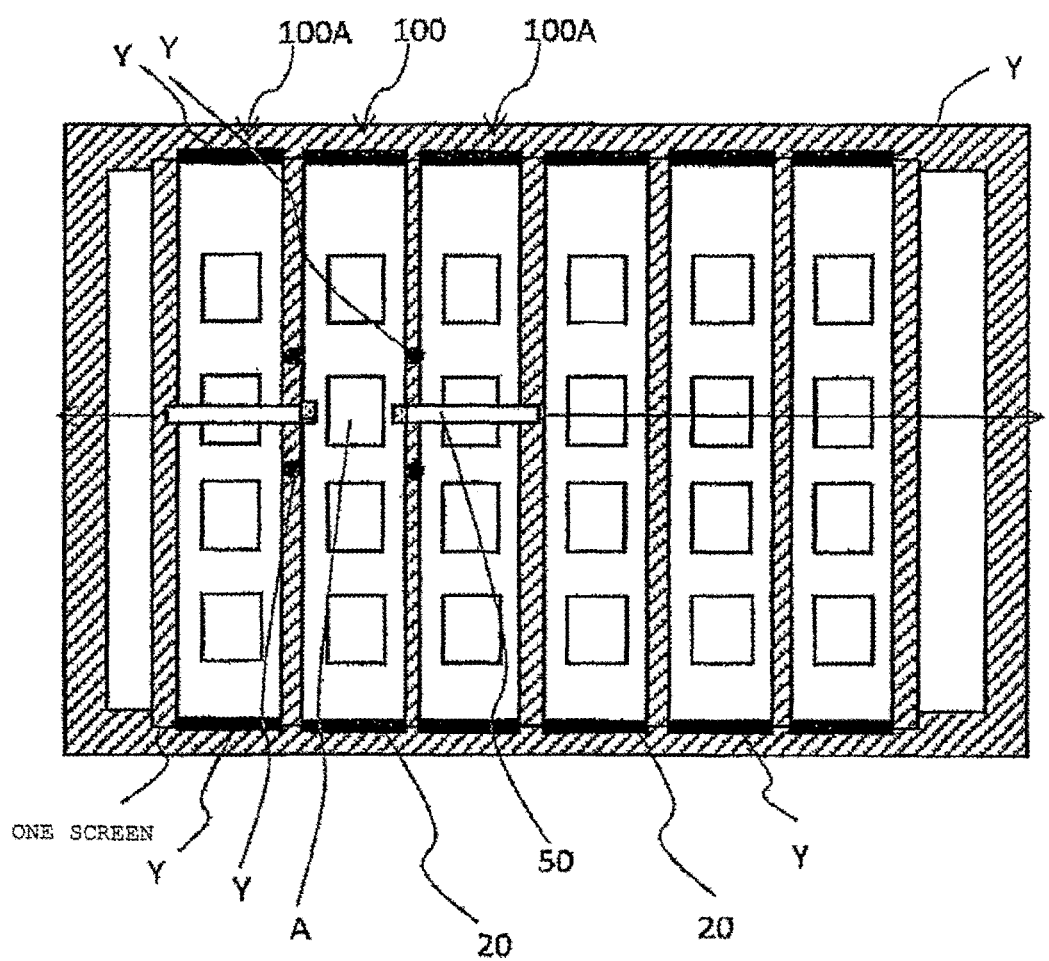

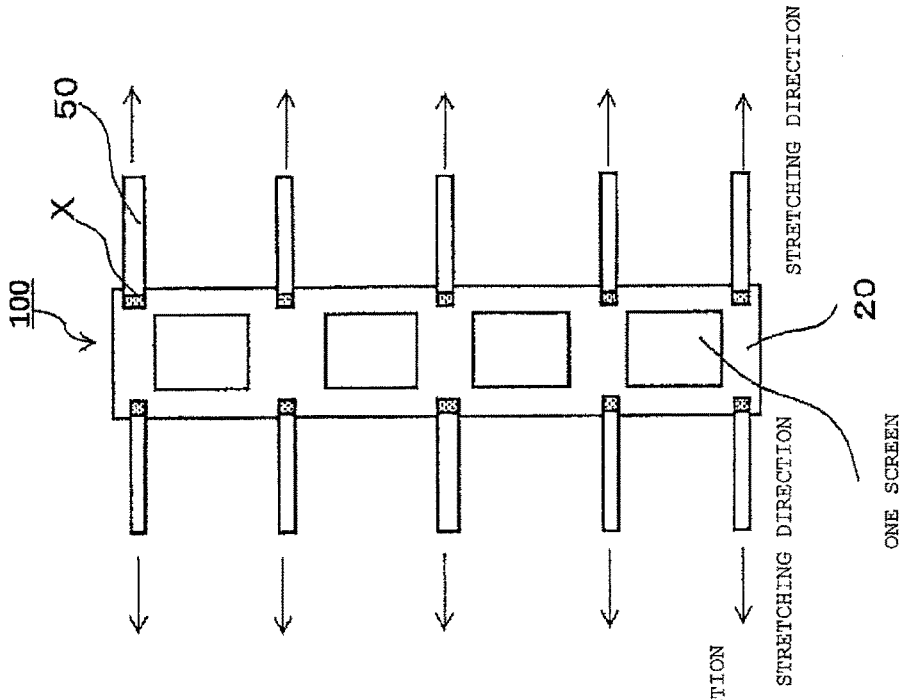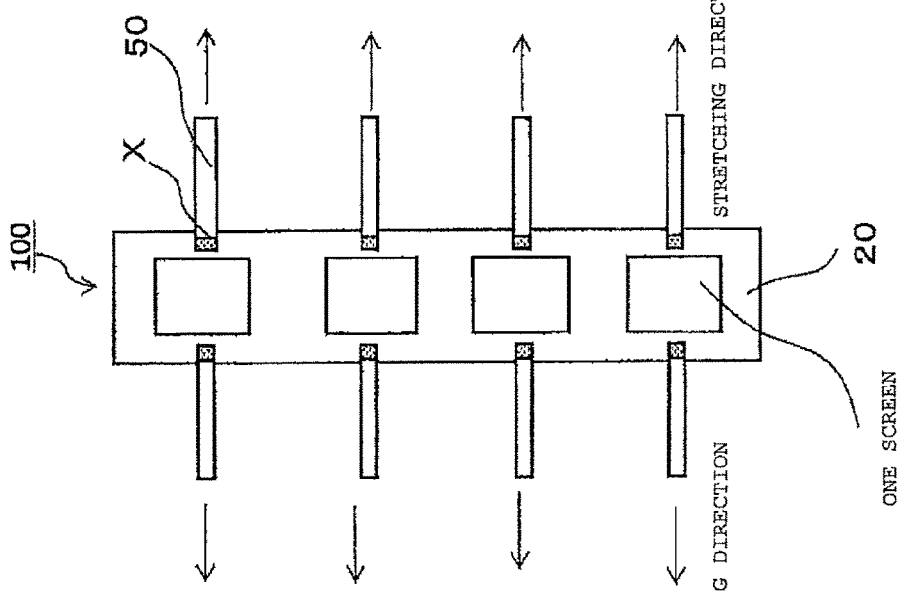

METHOD FOR STRETCHING VAPOR DEPOSITION MASK, METHOD FOR PRODUCING FRAME-EQUIPPED VAPOR DEPOSITION MASK, METHOD FOR PRODUCING ORGANIC SEMICONDUCTOR ELEMENT, AND STRETCHING APPARATUS

CROSS-REFERENCE TO RELATED APPLICATIONS

This application is a Continuation of U.S. application Ser. No. 15/126,651, filed Sep. 16, 2016, which is a 371 National Stage of PCT/JP2015/059875, filed Mar. 30, 2015, the entireties of which are incorporated herein by reference, and claims the benefit under 35 USC § 119(a)-(d) of Japanese Application No. 2014-074863 filed on Mar. 31, 2014 and Japanese Application No. 2015-067153 filed on Mar. 27, 2015.

TECHNICAL FIELD

The present disclosure relate to a method for stretching a vapor deposition mask, a method for producing a frame-equipped vapor deposition mask, a method for producing an organic semiconductor element, and a stretching apparatus.

BACKGROUND ART

With upsizing of the products using organic EL elements or increase in substrate sizes, a demand for upsizing is also growing with respect to vapor deposition masks, and the metal plates for use in production of the vapor deposition masks constituted of metals are also upsized. However, with the present metal processing technique, it is difficult to form openings in a large metal plate with high precision, which cannot respond to enhancement in definition of the openings. Moreover, in the case of a vapor deposition mask constituted of only a metal, the mass thereof also increases with upsizing, and the total mass including a frame also increases, which becomes a hindrance to handling.

Under such circumstances, in Patent Document 1, there is proposed a vapor deposition mask including a metal mask in which slits are provided and a resin mask which is positioned on the surface of the metal mask and in which openings corresponding to a pattern to be produced by vapor deposition are arranged for a plurality of rows in the lengthwise direction and in the crosswise direction, the metal mask and the resin mask being stacked. The vapor deposition mask proposed in Patent Document 1 is regarded as being capable of satisfying both high definition and lightweight in upsizing, and moreover, forming a vapor deposition pattern with high definition.

CITATION LIST

Patent Document

Patent Document 1: Japanese Patent No. 5288072

SUMMARY

A primary object of an embodiment of the present invention is to provide a method for stretching a vapor deposition mask capable of stretching a vapor deposition mask as disclosed in Patent Document 1 above in a simple method, a method for producing a frame-equipped vapor deposition mask using the stretching method, a method for producing an organic semiconductor element using the vapor deposition mask, and a stretching apparatus used for these methods.

There is provided a method for stretching a vapor deposition mask according to an embodiment of the present invention in order to solve the aforementioned problem, the vapor deposition mask including a metal mask in which a slit is formed and a resin mask in which an opening corresponding to a pattern to be produced by vapor deposition is formed at a position overlapping with the slit, the metal mask and the resin mask being stacked, the method including: a stretching assistance member fixing step of overlapping a stretching assistance member on one surface of the vapor deposition mask and fixing the stretching assistance member to the vapor deposition mask in at least part of a portion in which the one surface of the vapor deposition mask and the stretching assistance member overlap with each other; and a first stretching step of stretching the vapor deposition mask fixed to the stretching assistance member by pulling the stretching assistance member fixed to the vapor deposition mask.

Moreover, in the aforementioned method for stretching a vapor deposition mask, the method may further include a second stretching step of stretching the vapor deposition mask in a first direction before the first stretching step, and in the first stretching step, the vapor deposition mask fixed to the stretching assistance member may be stretched in a second direction different from the first direction by pulling the stretching assistance member fixed to the vapor deposition mask.

Moreover, there is provided a method for producing a frame-equipped vapor deposition mask according to an embodiment of the present invention in order to solve the aforementioned problem, the method including: a preparing step of preparing a vapor deposition mask including a metal mask in which a slit is formed and a resin mask in which an opening corresponding to a pattern to be produced by vapor deposition is formed at a position overlapping with the slit, the metal mask and the resin mask being stacked; a stretching assistance member fixing step of overlapping a stretching assistance member on one surface of the vapor deposition mask and fixing the stretching assistance member to the vapor deposition mask in at least part of a portion in which the one surface of the vapor deposition mask and the stretching assistance member overlap with each other; a first stretching step of stretching the vapor deposition mask fixed to the stretching assistance member by pulling the stretching assistance member fixed to the vapor deposition mask; and a frame fixing step of fixing the vapor deposition mask in a state of being stretched in the first stretching step to a frame in which a through hole is formed.

Moreover, in the aforementioned method for producing a frame-equipped vapor deposition mask, the method may further include a second stretching step of stretching the vapor deposition mask in a first direction before the first stretching step, and in the first stretching step, the vapor deposition mask fixed to the stretching assistance member may be stretched in a second direction different from the first direction by pulling the stretching assistance member fixed to the vapor deposition mask.

Moreover, in the aforementioned method for producing a frame-equipped vapor deposition mask, the frame-equipped vapor deposition mask may be a frame-equipped vapor deposition mask constituted by arranging and fixing a plurality of the vapor deposition masks to the frame, in a stage for producing the frame-equipped vapor deposition mask, at least one vapor deposition mask of the plurality of vapor deposition masks may be fixed to the frame through the stretching assistance member fixing step, the first stretching step and the frame fixing step, and in the first stretching step, by pulling the stretching assistance member fixed to the one vapor deposition mask, the one vapor deposition mask fixed to the stretching assistance member may be stretched in a direction toward a vapor deposition mask adjacent to the one vapor deposition mask.

Moreover, in the aforementioned method for producing a frame-equipped vapor deposition mask, the method may further include a second stretching step of stretching the one vapor deposition mask in a direction different from the direction toward the adjacent vapor deposition mask before the first stretching step is performed.

Moreover, there is provided a method for producing an organic semiconductor element according to an embodiment of the present invention in order to solve the aforementioned problem, the method including a step of forming a vapor deposition pattern on a vapor deposition target using a frame-equipped vapor deposition mask in which a vapor deposition mask is fixed to a frame, wherein in the step of forming the vapor deposition pattern, the vapor deposition mask fixed to the frame is a frame-equipped vapor deposition mask produced through the steps including: a step of preparing the vapor deposition mask including a metal mask in which a plurality of slits are formed and a resin mask in which openings corresponding to a pattern to be produced by vapor deposition are formed at a position overlapping with the slits, the metal mask and the resin mask being stacked; a stretching assistance member fixing step of overlapping a stretching assistance member on one surface of the vapor deposition mask and fixing the stretching assistance member to the vapor deposition mask in at least part of a portion in which the one surface of the vapor deposition mask and the stretching assistance member overlap with each other; a first stretching step of stretching the vapor deposition mask fixed to the stretching assistance member by pulling the stretching assistance member fixed to the vapor deposition mask; and a frame fixing step of fixing the vapor deposition mask in a state of being stretched in the first stretching step to the frame in which a through hole is formed.

Moreover, there is provided a stretching apparatus for stretching a vapor deposition mask according to an embodiment of the present invention in order to solve the aforementioned problem, the vapor deposition mask including a metal mask in which a slit is formed and a resin mask in which an opening corresponding to a pattern to be produced by vapor deposition is formed at a position overlapping with the slit, the metal mask and the resin mask being stacked, the apparatus comprising: a stretching assistance member; and a driving device for pulling the stretching assistance member, wherein the stretching assistance member is capable of being fixed in at least part of a portion overlapping with one surface of the vapor deposition mask when overlapped with the one surface of the vapor deposition mask.

Advantageous Effects

According to the method for stretching a vapor deposition mask and the stretching apparatus of an embodiment of the present invention, a vapor deposition mask which satisfies both high definition and lightweight in upsizing can be stretched in a simple method. Moreover, according to the method for producing a frame-equipped vapor deposition mask of an embodiment of the present invention, a frame-equipped vapor deposition mask capable of forming a vapor deposition pattern on a vapor deposition target with excellent precision can be obtained. Moreover, according to the method for producing an organic semiconductor element of an embodiment of the present invention, organic semiconductor elements excellent in quality can be produced in excellent yield.

BRIEF DESCRIPTION OF DRAWINGS

FIG. 1(a) being an elevation view thereof as seen from a metal mask side and FIG. 1(b) being a cross-sectional view taken along the line A-A of FIG. 1(a).

FIG. 4 is an elevation view of the vapor deposition mask of Embodiment (A) prepared in the preparing step as seen from the metal mask side.

FIGS. 5(a)-5(b) present elevation views of the vapor deposition mask of Embodiment (A) prepared in the preparing step as seen from the metal mask side.

FIGS. 8(a)-8(c) present diagrams for explaining a stretching assistance member fixing step and presents elevation views of the vapor deposition masks as seen from the resin mask side.

FIGS. 10(a)-10(c) present diagrams for explaining a first stretching step and FIGS. 10(a) to (c) are elevation views of the vapor deposition masks as seen from the resin mask side.

FIGS. 11(a)-11(c) present diagrams for explaining the first stretching step and FIGS. 11(a) to (c) are elevation views of the vapor deposition masks as seen from the resin mask side.

FIGS. 12(a)-12(c) present diagrams for explaining the first stretching step and FIGS. 12(a) to (c) are elevation views of the vapor deposition masks as seen from the resin mask side.

FIG. 18 is an elevation view exemplarily showing a fixing method for the frame-equipped multiple attached vapor deposition mask.

FIGS. 20(a)-20(b) present diagrams for explaining the first stretching step and FIGS. 20(a) and (b) are elevation views of the vapor deposition masks as seen from the resin mask side.

DESCRIPTION OF EMBODIMENTS

A method for producing a frame-equipped vapor deposition mask of an embodiment of the present invention is specifically described using the drawings.

<<Method for Producing Frame-Equipped Vapor Deposition Mask>>

A method for producing a frame-equipped vapor deposition mask of an embodiment includes: a preparing step of preparing a vapor deposition mask including a metal mask in which a slit is formed and a resin mask in which an opening corresponding to a pattern to be produced by vapor deposition is formed at a position overlapping with the slit, the metal mask and the resin mask being stacked; a stretching assistance member fixing step of overlapping a stretching assistance member on one surface of the vapor deposition mask and fixing the stretching assistance member to the vapor deposition mask in at least part of a portion in which the one surface of the vapor deposition mask and the stretching assistance member overlap with each other; a first stretching step of stretching the vapor deposition mask fixed to the stretching assistance member by pulling the stretching assistance member fixed to the vapor deposition mask; and a frame fixing step of fixing the vapor deposition mask in a state of being stretched in the first stretching step to a frame in which a through hole is formed. Hereafter, each of the steps is described.

<Preparing Step>

Figure 1A:
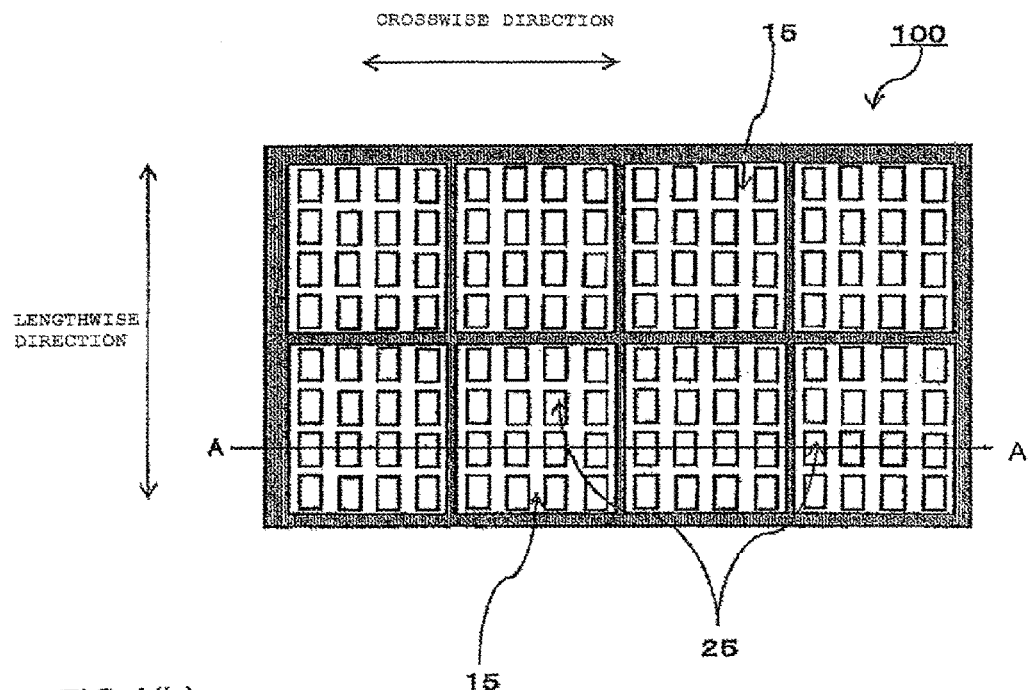
FIG. 1(a)-1(b) are diagrams exemplarily showing a vapor deposition mask prepared in a preparing step.
Figure 1B:
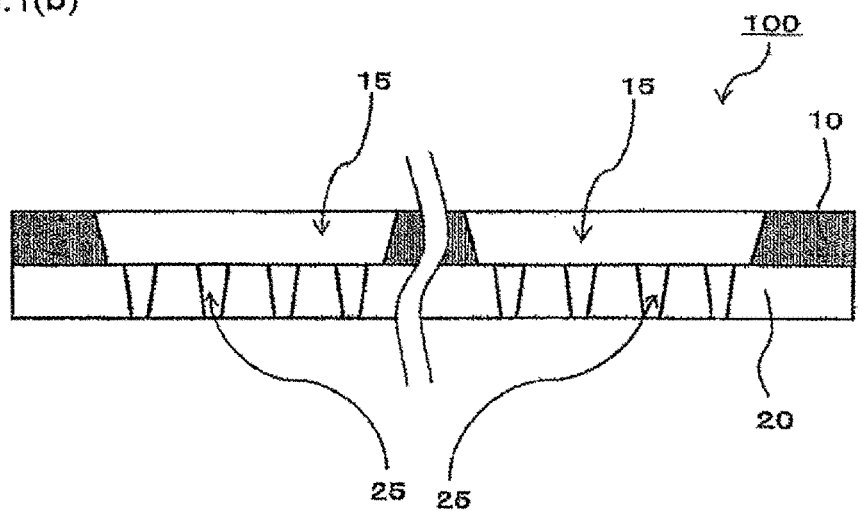

As shown in FIGS. 1(a) and 1(b), the present step is a step of preparing a vapor deposition mask 100 including a metal mask 10 in which a plurality of slits 15 are formed and a resin mask 20 in which openings 25 corresponding to a pattern to be produced by vapor deposition are formed at a position overlapping with the slits, the metal mask and the resin mask being stacked.

(Resin Mask)

As shown in FIG. 1, a plurality of openings 25 are provided in the resin mask 20. FIG. 1(a) is an elevation view of a vapor deposition mask of an embodiment as seen from the metal mask side and FIG. 1(b) is a schematic cross-sectional view taken along the line A-A in FIG. 1(a).

While in the mode shown in the figure, the opening shape of the opening 25 exhibits a rectangular shape, the opening shape is not specially limited but the opening shape of the opening 25 may be rhombic or polygonal or may be a shape having a curvature such as a circle and an ellipsoid. Notably, it can be said that the rectangular or polygonal opening shape is a preferable opening shape of the opening 25 in view of capability of securing a larger area of light emission as compared with the opening shape having a curvature such as a circle and an ellipsoid.

The material of the resin mask 20 is not limited but, for example, a material that enables formation of the opening 25 with high definition by laser processing or the like, has a low rate of dimensional change and a low rate of humidity absorption under heat and with passage of time, and is light weight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinylalcohol copolymer resin, an ethylene-methacrylic acid copolymer resin, a polyvinyl chloride resin, a polyvinylidene chloride resin, cellophane, an ionomer resin and the like can be cited. Among the materials shown above by way of example, the resin materials with the thermal expansion coefficients of about 16 ppm/° C. or less are preferable, the resin materials with the rates of humidity absorption of about 1.0% or less are preferable, and the resin materials including both conditions are particularly preferable. The resin mask using these resin materials enables dimensional precision of the openings 25 to be improved and a rate of dimensional change and a rate of humidity absorption under heat and with passage of time to be small.

The thickness of the resin mask 20 is not specially limited but, in the case of further improving the effect of suppressing generation of a shadow, the thickness of the resin mask 20 is preferably about 25 µm or less, still preferably less than about 10 µm. A preferable range of the lower limit value is not specially limited but, in the case where the thickness of the resin mask 20 is less than about 3 µm, defects such as a pinhole tend to arise and a risk of deformation or the like increases. In particular, by setting the thickness of the resin mask 20 to be about 3 µm or more and less than about 10 µm, still preferably about 4 µm or more and about 8 µm or less, the influence of a shadow in formation of a high definition pattern exceeding 400 µppi can be more effectively prevented. Moreover, while the resin mask 20 may be directly bonded to the metal mask 10 mentioned later or may be bonded thereto via an adhesive layer, in the case where the resin mask 20 is bonded to the metal mask 10 via the adhesive layer, the total thickness of the resin mask 20 and the adhesive layer is preferably within the aforementioned preferable thickness range. Notably, the shadow is a phenomenon that a part of a vapor deposition material released from a vapor deposition source collides with inner wall surfaces of the slit of the metal mask and/or the opening of the resin mask and does not reach the vapor deposition target, and thereby, a portion without vapor deposition that has a film thickness smaller than the intended vapor deposition film thickness arises.

The sectional shape of the opening 25 is not specially limited and end surfaces that face each other and are of the resin mask forming the opening 25 may be substantially parallel to each other, but as shown in FIG. 1(b), the sectional shape of the opening 25 is preferably the shape having broadening toward a vapor deposition source. In other words, it preferably has a taper surface having broadening toward the metal mask 10 side. While a taper angle can be properly set with the thickness or the like of the resin mask taken into consideration, an angle formed by a straight line connecting a lower bottom distal end in the opening of the resin mask and an upper bottom distal end of the opening of the same resin mask and the bottom surface of the resin mask, in other words, an angle formed by an inner wall surface of the opening 25 and a surface of the resin mask 20 on the side that is not in contact with the metal mask 10 (a lower surface of the resin mask in the mode shown in the figure) in the cross section in the thickness direction of the inner wall surface constituting the opening 25 of the resin mask 20 is preferably within a range of about 5° to about 85°, still preferably within a range of about 15° to about 75°, further preferably within a range of about 25° to about 65°. In particular, within this range, it is preferably an angle smaller than a vapor deposition angle of a vapor deposition machine to be used. Moreover, in the mode shown in the figure, while an end surface that forms the opening 25 exhibits a linear shape, it is not limited thereto but may be in a curved shape convex outward, in other words, a shape of the entirety of the opening 25 may be a bowl shape.

(Metal Mask)

As shown in FIG. 1(*b*), the metal mask 10 is stacked on one surface of the resin mask 20. The metal mask 10 is constituted of metal, in which the slits 15 extending in the lengthwise direction or the crosswise direction are arranged. The slit 15 is synonymous with an opening. An arrangement example of the slits is not specially limited. The slits extending in the lengthwise direction and the crosswise direction may be arranged in a plurality of rows in the lengthwise direction and the crosswise direction. The slits extending in the lengthwise direction may be arranged in a plurality of rows in the crosswise direction. The slits extending in the crosswise direction may be arranged in a plurality of rows in the lengthwise direction. Moreover, they may be arranged in only one row in the lengthwise direction or the crosswise direction. Notably, "lengthwise direction" and "crosswise direction" stated in the present specification indicate the vertical direction and the horizontal direction in the drawings, respectively, and may be any directions of the longitudinal direction and the width direction of the vapor deposition mask, the resin mask and the metal mask. For example, the longitudinal direction of the vapor deposition mask, the resin mask and the metal mask may be set to be the "lengthwise direction", or the width direction thereof may be set to be the "lengthwise direction". Moreover, while in the present specification, the case where the shape of the vapor deposition mask in plan view is a rectangular shape is exemplarily described, it may be another shape such, for example, as a circular shape and a polygonal shape such as a rhombic shape. In this case, the longitudinal direction of the diagonal line, the radial direction, or any direction only has to be set as the "longitudinal direction", the direction perpendicular to the "longitudinal direction" set as the "width direction (sometimes referred to as short-side direction)".

The material of the metal mask 10 is not specially limited but a conventionally known one in the field of the vapor deposition mask can be properly selected and used, and, for example, a metal material such as stainless steel, an iron-nickel alloy and an aluminum alloy can be cited. Above all, an invar material which is an iron-nickel alloy can be preferably used since an invar material is hardly deformed by heat.

While the thickness of the metal mask 10 is not specially limited, in order to more effectively prevent generation of a shadow, it is preferably about 100 µm or less, still preferably about 50 µm or less, particularly preferably about 35 µm or less. Notably, in the case of being thinner than about 5 µm, risks of rupture and deformation tend to increase and handling tends to become difficult.

Moreover, while in the mode shown in FIG. 1(*a*), the shape of the opening of the slit 15 in plan view exhibits a rectangular shape, the opening shape is not specially limited but the opening shape of the slit 15 may be any shape such as a trapezoid and a circle.

The sectional shape of the slit 15 formed in the metal mask 10 is not specially limited but is preferably a shape having broadening toward the vapor deposition source as shown in FIG. 1(*b*). More specifically, an angle formed by a straight line connecting the lower bottom distal end in the slit 15 of the metal mask 10 and the upper bottom distal end in the same slit 15 of the same metal mask 10 and the bottom surface of the metal mask 10, in other words, an angle formed by the inner wall surface of the slit 15 and the surface of the metal mask 10 on the side of being in contact with the resin mask 20 (the lower surface of the metal mask in the shown mode) in the cross section in the thickness direction of the inner wall surface constituting the slit 15 of the metal mask 10 is preferably within a range of about 5° to about 85°, still preferably within a range of about 15° to about 80°, further preferably within a range of about 25° to about 65°. In particular, within this range, it is preferably an angle smaller than a vapor deposition angle of a vapor deposition machine to be used.

A method of stacking the metal mask 10 on the resin mask is not specially limited but the metal mask 10 may be pasted on the resin mask 20 using various adhesive agents or the resin mask that has self-adhesion may be used. The dimensions of the resin mask 20 and the metal mask 10 may be the same or may be different dimensions. Notably, with fixing to a frame which is arbitrarily performed afterward taken into consideration, the dimension of the resin mask 20 is preferably made smaller than that of the metal mask 10 to set the outer circumferential portion of the metal mask 10 to be in the state of exposure, which facilitates welding of the metal mask 10 to the frame.

Hereafter, preferable modes of the vapor deposition mask prepared in the present step are described, exemplified by Embodiment (A) and Embodiment (B).

<Vapor Deposition Mask of Embodiment (A)>

Figure 2:
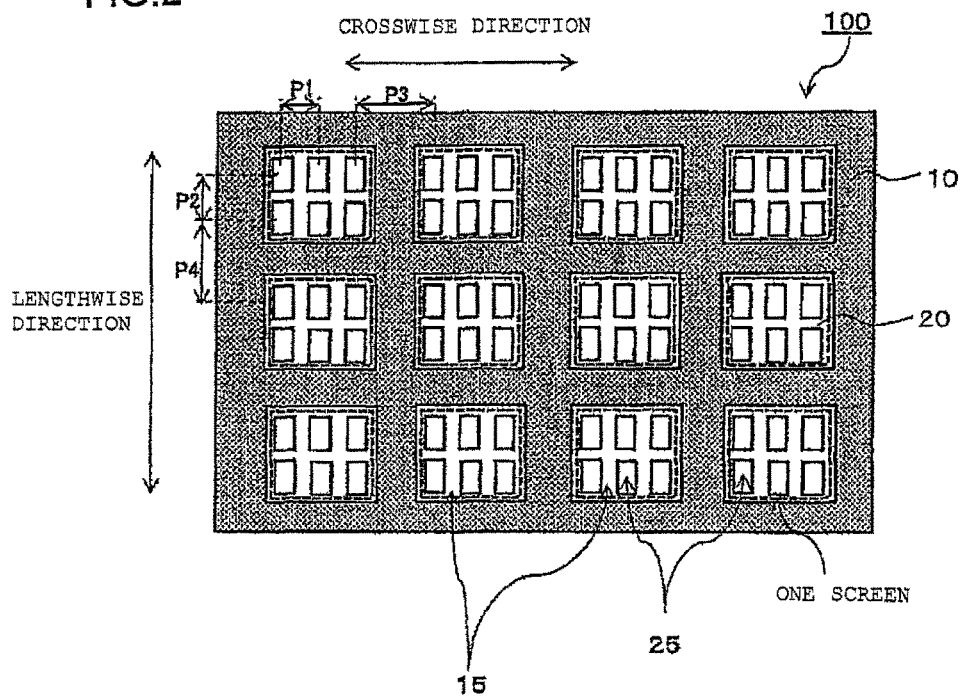
FIG. 2 is an elevation view of the vapor deposition mask of Embodiment (A) prepared in the preparing step as seen from the metal mask side.
Figure 3:
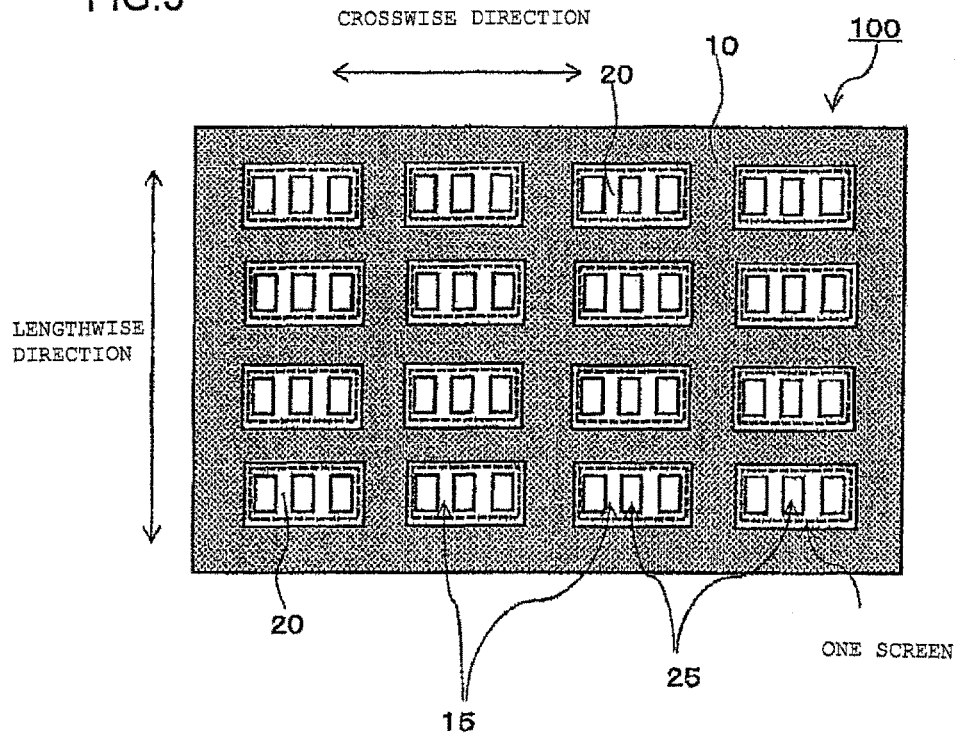
FIG. 3 is an elevation view of the vapor deposition mask of Embodiment (A) prepared in the preparing step as seen from the metal mask side.

As shown in FIG. 2, the vapor deposition mask 100 of Embodiment (A) is a vapor deposition mask for simultaneously forming vapor deposition patterns for a plurality of screens and includes the metal mask 10 in which the plurality of slits 15 are provided and the resin mask 20, the metal mask being stacked on one surface of the resin mask, wherein the openings needed for constituting the plurality of screens are provided in the resin mask 20, and each slit 15 is provided at a position overlapping with the entirety of at least one screen.

The vapor deposition mask 100 of Embodiment (A) is a vapor deposition mask used for simultaneously forming vapor deposition patterns for a plurality of screens. One vapor deposition mask 100 can simultaneously form vapor deposition patterns compatible with a plurality of products. "Openings" stated for the vapor deposition mask of Embodiment (A) mean patterns to be produced using the vapor deposition masks 100 of Embodiment (A). For example, when the vapor deposition mask is used for forming an organic layer in an organic EL display, the shape of the openings 25 is a shape of the organic layer. Moreover, "one screen" is constituted of an aggregate of openings 25 corresponding to one product. When the one product is an organic EL display, an aggregate of organic layers needed for forming one organic EL display, in other words, an aggregate of openings 25 to be the organic layers is "one screen". Further, in the vapor deposition mask 100 of Embodiment (A), in order to simultaneously form the vapor deposition patterns for the plurality of screens, the aforementioned "one screen" is arranged for each of the plurality of screens in the resin mask 20 at predetermined intervals. Namely, in the resin mask 20, the openings 25 needed for constituting the plurality of screens are provided.

The vapor deposition mask of Embodiment (A) includes the metal mask 10 in which the plurality of slits 15 are provided, the metal mask being provided on one surface of the resin mask, wherein each slit is provided at the position overlapping with the entirety of at least one screen. In other words, it is characterized in that between the openings 25 needed for constituting one screen, metal line portions which have the same length as the length of the slit 15 in the lengthwise direction and have the same thickness as that of the metal mask 10 between the openings 25 adjacent in the crosswise direction, or metal line portions which have the same length as the length of the slit 15 in the crosswise direction and have the same thickness as that of the metal mask 10 between the openings 25 adjacent in the lengthwise direction do not exist. Hereafter, the metal line portions which have the same length as the length of the slit 15 in the lengthwise direction and have the same thickness as that of the metal mask 10 and the metal line portions which have the same length as the length of the slit 15 in the crosswise direction and have the same thickness as that of the metal mask 10 are sometimes collectively referred to simply as metal line portions.

According to the vapor deposition mask 100 of Embodiment (A), even when the dimension of the openings 25 needed for constituting one screen and the pitch between the openings 25 constituting one screen are made small, for example, even when the dimension of the openings 25 and the pitch between the openings 25 are made extremely fine in order to form a screen exceeding 400 ppi, interference due to metal line portions can be prevented and an image with high definition can be formed. Notably, when one screen is divided by a plurality of slits, in other words, when the metal line portions having the same thickness as that of the metal mask 10 exist between the openings 25 constituting one screen, as the pitch between the openings 25 constituting one screen is smaller, the metal line portions existing between the openings 25 more become a hindrance in forming the vapor deposition pattern on the vapor deposition target and the vapor deposition pattern with high definition is more difficult to be formed. In other words, when the metal line portions having the same thickness as that of the metal mask 10 exist between the openings 25 constituting one screen, the metal line portions in the case of setting the frame-equipped vapor deposition mask cause generation of a shadow, which results in difficulty of formation of a screen with high definition.

Next, referring to FIG. 2 to FIG. 6, the openings 25 constituting one screen are exemplarily described. Notably, a region enclosed by a broken line in the modes shown in the figures is one screen. While in the modes shown in the figures, an aggregate of a small number of openings 25 is one screen for convenience of description, not limited to these modes, for example, the openings 25 for millions of pixels may be present in one screen, where one opening 25 is one pixel.

In the mode shown in FIG. 2, one screen is constituted of an aggregate of openings 25 having a plurality of openings 25 provided in the lengthwise direction and the crosswise direction. In the mode shown in FIG. 3, one screen is constituted of an aggregate of openings 25 having a plurality of openings 25 provided in the crosswise direction. Moreover, in the mode shown in FIG. 4, one screen is constituted of an aggregate of openings 25 having a plurality of openings 25 in the lengthwise direction. Further, in FIG. 2 to FIG. 4, the slit 15 is provided at a position overlapping with the entirety of one screen.

As described above, the slit 15 may be provided at a position overlapping with only one screen, or as shown in FIGS. 5(a) and 5(b), may be provided at a position overlapping with the entirety of two or more screens. In FIG. 5(a), in the resin mask 10 shown in FIG. 2, the slit 15 is provided at a position overlapping with the entirety of two screens continuous in the crosswise direction. In FIG. 5(b), the slit 15 is provided at a position overlapping with the entirety of three screens continuous in the lengthwise direction.

Next, exemplified by the mode shown in FIG. 2, pitches between the openings 25 constituting one screen and pitches between the screens are described. The pitches between the openings 25 constituting one screen and the dimension of the opening 25 are not specially limited but can be properly set depending on the pattern to be produced by vapor deposition. For example, when forming the vapor deposition pattern with high definition of 400 ppi, a pitch (P1) in the crosswise direction and a pitch (P2) in the lengthwise direction between the neighboring openings 25 out of the openings 25 constituting one screen are about 60 μm. Moreover, the dimension of the opening is about 500μm$^2$ to about 1000 μm$^2$. Moreover, one opening 25 is not limited to correspond to one pixel but, for example, a plurality of pixels can also be collectively one opening 25 depending on a pixel arrangement.

While a pitch (P3) in the crosswise direction and a pitch (P4) in the lengthwise direction between the screens are not specially limited but, as shown in FIG. 2, when one slit 15 is provided at the position overlapping with the entirety of one screen, metal line portions are to exist between the screens. Accordingly, when the pitch (P3) in the crosswise direction and the pitch (P4) in the lengthwise direction between the screens are smaller than or substantially equal to the pitch (P1) in the crosswise direction and the pitch (P2) in the lengthwise direction of the openings 25 provided in one screen, the metal line portions existing between the screens are liable to break. Accordingly, with this point taken into consideration, the pitch (P3, P4) between the screens is preferably wider than the pitch (P1, P2) between the openings 25 constituting one screen. The pitch (P3, P4) between the screens is exemplarily about 1 mm to about 100 mm. Notably, the pitch between the screens means the pitch between the neighboring openings in one screen and another screen adjacent to the one screen. The same holds true for the pitch between the openings 25 and the pitch between the screens in the vapor deposition mask of Embodiment (B) mentioned later.

Notably, as shown in FIG. 5, when one slit 15 is provided at the position overlapping with the entirety of two or more screens, metal line portions constituting the inner wall surfaces of the slit are not to exist between the plurality of screens provided in the one slit 15. Accordingly, in this case, the pitch between the two or more screens provided at the position overlapping with the one slit 15 may be substantially equal to the pitch between the openings 25 constituting one screen.

Moreover, on the resin mask 20, grooves (not shown) are preferably formed to extend in the lengthwise direction or the crosswise direction of the resin mask 20. While in the case of application of heat in vapor deposition, there is a possibility that the resin mask 20 undergoes thermal expansion, and thereby, changes in dimension and position of the opening arise, by forming the grooves, they can absorb the expansion of the resin mask, and can prevent the changes in dimension and position of the opening 25 caused by the resin mask 20 expanding in a predetermined direction as a whole due to accumulation of thermal expansions arising in portions in the resin mask. Formation positions of the grooves are not limited but while they may be provided between the openings 25 constituting one screen and at positions overlapping with the openings 25, they are preferably provided between the screens. Moreover, the grooves may be provided on one surface of the resin mask, for example, only on the surface on the side that is in contact with the metal mask, or may be provided only on the surface on the side that is not in contact with the metal mask. Otherwise, they may be provided on both surfaces of the resin mask 20.

Moreover, the grooves extending in the lengthwise direction may be between the neighboring screens, or the grooves extending in the crosswise direction may be formed between the neighboring screens. Furthermore, the grooves can also be formed in an aspect having these combined.

The depth and the width of the grooves are not specially limited but since the rigidity of the resin mask 20 tends to decrease in the case where the depth of the grooves is too large and in the case where the width thereof is too large, setting is needed with this point taken into consideration. Moreover, the sectional shape of the grooves is not specially limited but only has to be arbitrarily selected as a U-shape, a V-shape or the like with the processing method and the like taken into consideration. The same holds true for the vapor deposition mask of Embodiment (B).

<Vapor Deposition Mask of Embodiment (B)>

Figure 6:
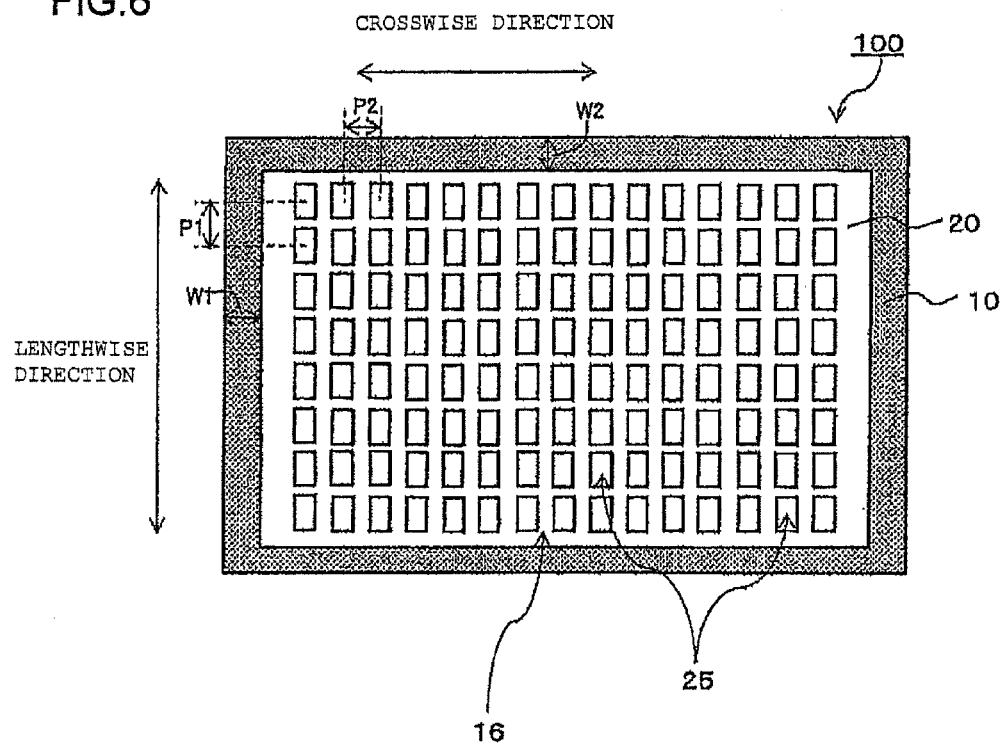
FIG. 6 is an elevation view of the vapor deposition mask of Embodiment (B) prepared in the preparing step as seen from the metal mask side.

Next, the vapor deposition mask of Embodiment (B) is described. As shown in FIG. 6, the vapor deposition mask of Embodiment (B) includes the metal mask 10 in which one slit (one hole 16) is provided and the resin mask 20 in which the plurality of openings 25 corresponding to a pattern to be produced by vapor deposition are provided, the metal mask being stacked on one surface of resin mask, wherein all of the plurality of openings 25 are provided at a position overlapping with the one hole provided in the metal mask 10.

The opening 25 stated for the vapor deposition mask of Embodiment (B) means an opening needed for forming the vapor deposition pattern on the vapor deposition target. An opening not needed for forming the vapor deposition pattern on the vapor deposition target may be provided at a position of not overlapping with the one hole 16. Notably, FIG. 6 is an elevation view which exemplarily shows the vapor deposition mask of Embodiment (B) and is of the vapor deposition mask as seen from the metal mask side.

In the vapor deposition mask 100 of Embodiment (B), the metal mask 10 having the one hole 16 is provided on the resin mask 20 having the plurality of openings 25, and all of the plurality of openings 25 are provided at a position overlapping with the one hole 16. In the vapor deposition mask 100 of Embodiment (B) that has this configuration, metal line portions that have the same thickness as the thickness of the metal mask or a larger thickness than the thickness of the metal mask do not exist between the openings 25. Hence, as described for the aforementioned vapor deposition mask of Embodiment (A), the vapor deposition pattern with high definition can be formed to match the dimensions of the openings 25 provided in the resin mask 20 without suffering interference of metal line portions.

Moreover, according to the vapor deposition mask of Embodiment (B), there is almost no influence of a shadow even when the thickness of the metal mask 10 is made large. Hence, the thickness of the metal mask 10 can be made larger to such an extent that durability and handling ability are sufficiently satisfied. While a vapor deposition pattern with high definition can be formed, durability and handling ability can be improved.

(Resin Mask)

The resin mask 20 in the vapor deposition mask of Embodiment (B) is constituted of resin, in which as shown in FIG. 6, the plurality of openings 25 corresponding to a pattern to be produced by vapor deposition are provided at a position overlapping with the one hole 16. The openings 25 correspond to the pattern to be produced by vapor deposition. By a vapor deposition material released from a vapor deposition source passing through the openings 25, the vapor deposition pattern corresponding to the openings 25 is formed on the vapor deposition target. Notably, while in the mode shown in the figure, the openings arranged in a plurality of rows in the lengthwise direction and the crosswise direction are exemplarily described, they may be arranged only in the lengthwise direction or in the crosswise direction.

"One screen" in the vapor deposition mask 100 of Embodiment (B) means an aggregate of openings 25 corresponding to one product. When the one product is an organic EL display, an aggregate of organic layers needed for forming one organic EL display, in other words, an aggregate of openings 25 to be the organic layers is "one screen". While the vapor deposition mask of Embodiment (B) may be constituted of only "one screen" or may be provided by arranging the "one screen" for each of a plurality of screens, in the case where the "one screen" is arranged for each of the plurality of screens, the openings 25 are preferably provided at predetermined intervals on a screen-by-screen basis (refer to FIG. 5 for the vapor deposition mask of Embodiment (A)). The mode of "one screen" is not specially limited but, for example, the one screen can also be constituted of millions of openings 25, where one opening 25 is one pixel.

(Metal Mask)

The metal mask 10 in the vapor deposition mask 100 of Embodiment (B) is constituted of metal and includes the one hole 16. Further, in an embodiment of the present invention, the one hole 16 is disposed at a position overlapping with all of the openings 25 as seen head-on of the metal mask 10, in other words, at a position where all of the openings 25 arranged in the resin mask 20 can be seen.

Figure 7:
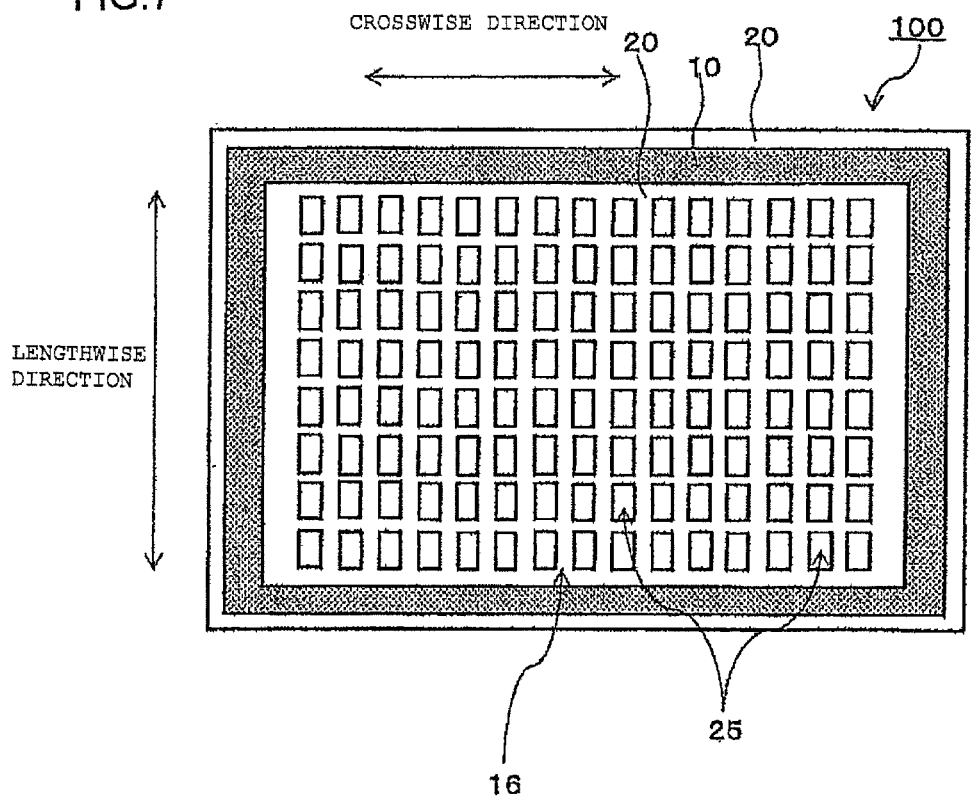
FIG. 7 is an elevation view of the vapor deposition mask of Embodiment (B) prepared in the preparing step as seen from the metal mask side.
Figure 9A:
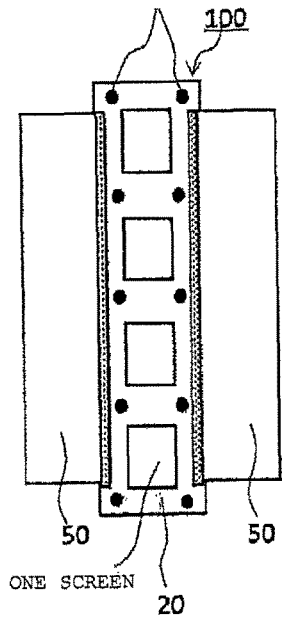
FIGS. 9(a)-9(e) present diagrams for explaining the stretching assistance member fixing step and FIGS. 9(a) to (e) are elevation views of the vapor deposition masks as seen from the resin mask side.
Figure 9B:
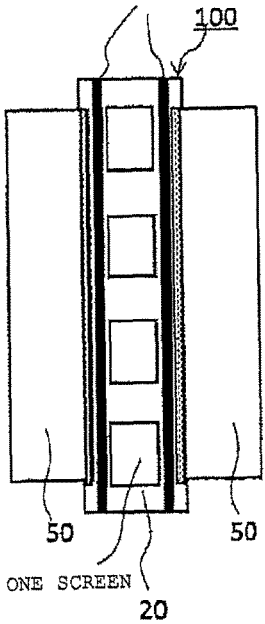
Figure 9C:
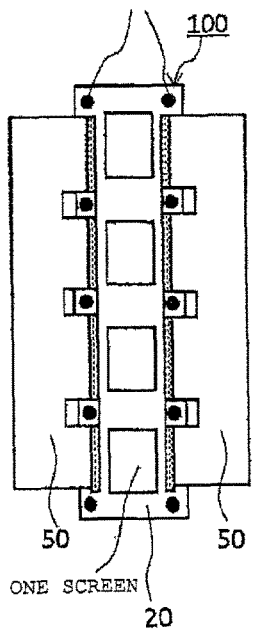
Figure 9D:
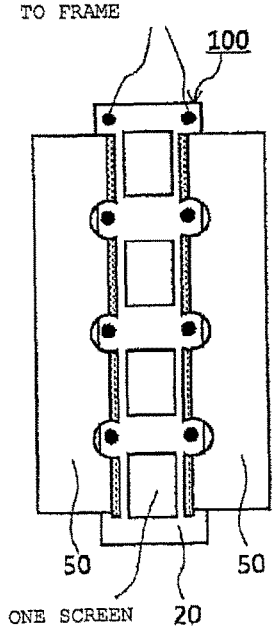
Figure 9E:
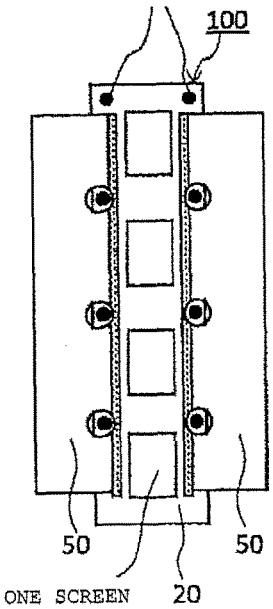

The metal portion constituting the metal mask 10, that is, the portion thereof other than the one hole 16 may be provided along the outer edge of the vapor deposition mask 100 as shown in FIG. 6, or the dimension of the metal mask 10 may be made smaller than that of the resin mask 20 to expose an outer circumferential portion of the resin mask 20 as shown in FIG. 7. Moreover, the dimension of the metal mask 10 may be made larger than that of the resin mask 20, so that a part of the metal portion is caused to protrude outward in the crosswise direction of the resin mask or outward in the lengthwise direction thereof. Notably, in any cases, the dimension of the one hole 16 is configured to be smaller than the dimension of the resin mask 20.

While a width (W1), in the crosswise direction, and a width (W2), in the lengthwise direction, of the metal portion constituting the wall surface of the one hole 16 of the metal mask 10 shown in FIG. 6 are not specially limited, as the width W1, W2 is made smaller, durability and handling ability tend to deteriorate more. Accordingly, W1 and W2 are preferably widths by which durability and handling ability are sufficiently satisfied. While appropriate widths can be properly set depending on the thickness of the metal mask 10, as an example of preferable widths, both W1 and W2 are about 1 mm to about 100 mm, which are the same widths of the metal mask in the vapor deposition mask of Embodiment (A).

Hereafter, the method for producing a vapor deposition mask of an embodiment prepared in the present step is exemplarily described. The vapor deposition mask 100 of an embodiment can be obtained by preparing the resin plate-equipped metal mask in which the metal mask 10 provided with the slits 15 is stacked on one surface of the resin plate, and next, irradiating the resin plate-equipped metal mask with laser through the slits 15 from the metal mask 10 side to form the openings 25 corresponding to a pattern to be produced by vapor deposition in the resin plate.

As a method of forming the resin plate-equipped metal mask, the metal mask 10 provided with the slits 15 is stacked on one surface of the resin plate. The resin plate can employ the materials described for the aforementioned resin mask 20.

As the method for forming the metal mask 10 in which the slits 15 are provided, a masking member, for example, a resist material is applied onto the surface of the metal plate, predetermined portions thereof are exposed and developed, and thereby, a resist pattern in which positions where the slits 15 are finally to be formed remain is formed. The resist material used as the masking member is preferably excellent in processing ability with desired resolution. Next, etching processing is performed by an etching method using the resist pattern as an etching resistant mask. After the completion of the etching, the resist pattern is cleaned and removed. In this way, the metal mask 10 in which the slits 15 are provided is obtained. The etching for forming the slits 15 may be performed on one surface side of the metal plate or may be performed on both surfaces thereof. Moreover, in the case where the slits 15 are formed in the metal plate using the stacked body in which the resin plate is provided on the metal plate, the masking member is applied onto the surface of the metal plate on the side that is not in contact with the resin plate, and the slits 15 are formed by the etching from one surface side. Notably, in the case where the resin plate has etching resistance with respect to the etching agent for the metal plate, masking of the surface of the resin plate is not needed but, in the case where the resin plate does not have resistance with respect to the etching agent for the metal plate, the masking member is needed to be applied onto the surface of the resin plate. Moreover, in the above, while the resist material is mainly described as the masking member, in place of the application of the resist material, a dry film resist may be laminated to perform the similar patterning.

In the aforementioned method, the resin plate constituting the resin plate-equipped metal mask may be a resin layer or a resin film formed by coating as well as a plate-shaped resin. In other words, the resin plate may be beforehand prepared, or the resin layer or the resin film to be the resin mask in the final stage can also be formed on the metal plate by a conventionally known coating method or the like.

The openings 25 can be formed using a laser processing method, fine press processing, photolithography processing or the like on the resin plate-equipped metal mask prepared above. By forming the openings, the vapor deposition mask 100 of an embodiment is obtained in which the metal mask 10 provided with the slits 15 is stacked on one surface of the resin mask 20 in which the openings 25 corresponding to the pattern to be produced by vapor deposition are provided. Notably, in view of capability of easily forming the openings 25 with high definition, the laser processing method is preferably used for the formation of the openings 25.

<Stretching Assistance Member Fixing Step>

As shown in FIGS. 8(a) to 8(c), the stretching assistance member fixing step is a step of overlapping stretching assistance members 50 on one surface of the vapor deposition mask 100 (in the mode shown in the figures, the surface of the resin mask 20), and fixing the stretching assistance members to the vapor deposition mask 100 in at least part of a portion in which the one surface of the vapor deposition mask 100 and the stretching assistance members 50 overlap with each other (signs X in the figures). FIG. 8 presents elevation views showing the states where the one surface of the vapor deposition mask and the stretching assistance members 50 are fixed to each other, and in the modes shown in the figures, the resin mask 20 and the stretching assistance members 50 are fixed to each other in the entirety of a portion in which the surface of the resin mask 20 of the vapor deposition mask 100 and the stretching assistance members 50 overlap with each other or in a part of the portion of overlapping. In other words, in plan view of the vapor deposition mask 100, that is, in the thicknesswise direction of the vapor deposition mask 100, the stretching assistance members 50 are arranged so as to overlap with one surface of the vapor deposition mask, and the one surface of the vapor deposition mask 100 and the stretching assistance members 50 are fixed to each other in the entirety of the portion of overlapping or in a part of the portion of overlapping. Notably, in FIG. 8, illustration of the openings provided in the resin mask 20 is omitted and one screen constituted of the plurality of openings is illustrated. The "one screen" is the same as those described for the aforementioned vapor deposition mask of Embodiment (A) and vapor deposition mask of Embodiment (B).

In the present step, the stretching assistance member 50 is overlapped on one surface of the vapor deposition mask 100, and the vapor deposition mask 100 and the stretching assistance member 50 are fixed to each other in at least part of a portion in which the one surface of the vapor deposition mask and the stretching assistance member 50 overlap with each other. In other words, the stretching assistance member 50 can be fixed at any position as long as it is a position which satisfies the condition of being able to be overlapped with the surface of the vapor deposition mask. Accordingly, differently from a conventionally known gripping device such, for example, as a clamp which fixes a vapor deposition mask to pinch its end part, the position where the stretching assistance member is fixed is not limited but it can be fixed to the vapor deposition mask 100 at any position. Notably, clamps and the like which perform fixation by gripping the end part or the like of a vapor deposition mask are excluded from the stretching assistance members 50 stated in the specification of the present application.

Moreover, in the mode shown in each figure, while the stretching assistance members 50 are fixed to the vapor deposition mask 100 in at least part of a portion in which one surface of the vapor deposition mask 100 and the stretching assistance members 50 overlap with each other (signs X in the figure), the vapor deposition mask 100 and the stretching assistance members 50 may be fixed to each other in the entirety of the portion in which the one surface of the vapor deposition mask 100 and the stretching assistance members 50 overlap with each other.

The stretching assistance member may be fixed onto the resin mask 20 as shown in the figures, or may also be fixed onto the metal mask 10. Notably, in a frame-equipped vapor deposition mask obtained in the final stage, the metal mask 10 of the vapor deposition mask 100 is typically fixed to a frame to oppose the same. Accordingly, with this point taken into consideration, the stretching assistance member 50 is preferably fixed in at least part that overlaps with the surface on the resin mask 20 side. Notably, as long as the stretching assistance member 50 can be removed from the surface of the vapor deposition mask after the vapor deposition mask is fixed to the frame, fixation in at least part that overlaps with the surface on the metal mask 10 side does not cause any problem.

The stretching assistance member 50 is sufficient to be fixed onto one surface of the vapor deposition mask 100 in at least part of a portion overlapping with the one surface of the vapor deposition mask 100 by some device, and its material is not limited at all. For example, the stretching assistance member 50 may be constituted of a resin material or a metal material, or may also be constituted of other materials such, for example, as a glass material, a ceramic material and a paper material.

The stretching assistance member 50 is not limited in its shape but is sufficient to exhibit a shape with which one surface of the vapor deposition mask 100 and the surface of the stretching assistance member can be fixed to each other by some device. In other words, the stretching assistance member 50 may have any shape. The stretching assistance member 50 by way of example exhibits a sheet shape, a cylindrical shape, a prismatic shape or the like. Notably, in the modes shown in the figures, while stretching of the vapor deposition mask 100 is performed using sheet-shaped stretching assistance members as the stretching assistance members 50, they are not limited to these modes. Moreover, the size and the thickness of the stretching assistance member 50 are not limited at all. For example, in the case of using a sheet-shaped stretching assistance member 50, the thickness and the like thereof are not limited at all. The surface of the stretching assistance member 50 and the vapor deposition mask come into direct or indirect contact with each other, and the mode of the contact is not specially limited but the surface of the stretching assistance member 50 and the vapor deposition mask may come into direct or indirect contact with each other in plane, on a line or at a point. For example, in the case of using a sheet-shaped stretching assistance member, the relevant stretching assistance member 50 and one surface of the vapor deposition mask 100 come into direct or indirect contact with each other in plane. Moreover, in the case of using a cylindrical stretching assistance member, the circumferential surface of the relevant stretching assistance member 50 and one surface of the vapor deposition mask come into direct or indirect contact with each other on a line.

The stretching assistance members 50 by way of example are joined to a driving device, and stretching of the vapor deposition mask 100 fixed to the relevant stretching assistance members is performed by operating the driving device to pull the stretching assistance members 50. For the driving device, a conventionally known one can be properly selected and, for example, a motor, an air cylinder, an electric actuator or the like can be cited. Moreover, not using a driving device, the vapor deposition mask 100 fixed to the stretching assistance members 50 can also be stretched. For example, the vapor deposition mask fixed to the stretching assistance members 50 can also be stretched by pulling the stretching assistance members 50 by hands. In this case, the stretching assistance members 50 are sufficient not to be joined to a driving device.

One surface of the vapor deposition mask 100 and the stretching assistance member 50 may be fixed to each other (i) in the state of direct contact of those or may also be fixed to each other (ii) in the state of indirect contact of those.

As modes of fixation of one surface of the vapor deposition mask 100 and the stretching assistance member 50 (i) in the state of direct contact of those, a mode using a material having magnetism for the stretching assistance member 50, a mode using a material having self-adhesion therefor, a mode using a material having self-adsorption and repeelability therefor, and a mode of fixing one surface of the vapor deposition mask 100 and the stretching assistance member 50 to each other with electrostatic adsorption or the like can be cited. For example, in the case of using a material having magnetism for the stretching assistance member 50, using the metal mask constituting the vapor deposition mask 100, the vapor deposition mask 100 and the stretching assistance member 50 can be caused to attract and be fixed to each other with magnetic force at a position where the stretching assistance member 50 and the metal mask 10 overlap with each other. Moreover, in the case of using a material having self-adsorption and repeelability for the stretching assistance member 50, using the self-adsorption, the stretching assistance member 50 can be fixed at a position where the stretching assistance member 50 and the surface of the vapor deposition mask overlap with each other. With the material having self-adsorption and repeelability, the stretching assistance member 50 can be fixed to the surface of the vapor deposition mask 100 even at a position not overlapping with the metal mask 10 in the thicknesswise direction.

Above all, it can be said that the material having magnetism and the material having self-adsorption and repeelability are preferable materials in that they can be used repeatedly. The self-adsorption of the stretching assistance member means a property with which it can be brought into close contact with the vapor deposition mask while pushing away the air in coming into contact therewith. The repeelability of the stretching assistance member means a property with which pulling up one end of the stretching assistance member fixed to the vapor deposition mask causes the peeling to spread around and enables the entirety of the stretching assistance member to be removed. As materials having the aforementioned self-adsorption and repeelability, self-adhesion resins such as silicon resin-based ones, polyolefin resin-based ones, and polyurethane-based thermoplastic elastomer-based ones, rubber-based ones, and polyvinyl chloride resin-based ones can be cited. As materials having self-adsorption and repeelability, for example, commercial products such as Sumilon S (product name) by Sumitomo Chemical Co. Ltd., Olefin Gel Polymer Sheet (product name) by Panac Corporation, and FIXFILM (product name) by Fujicopian Co. Ltd. can also be used. The material having magnetism and the material having self-adsorption and repeelability can also be combined and used. For the stretching assistance member 50, one constituted of a single member may be used, or one constituted of a plurality of members which are combined may also be used. Moreover, a method of combination in the case where a plurality of members are combined to constitute the stretching assistance member is not limited but there may be the stretching assistance member 50 constituted by arranging the plurality of members regardless of their orientation or the stretching assistance member 50 constituted by stacking the plurality of members. For example, in the case of the stretching assistance members 50 obtained by combining the material having magnetism on the material having self-adsorption, the vapor deposition mask 100 can be stretched while a property of the material having magnetism is utilized to tentatively fix the metal mask and assistance frames 65 mentioned later to each other. Moreover, in the case of using a plurality of stretching assistance members 50, members and materials constituting the individual stretching assistance members may be the same or different from one another.

As a mode of fixation of one surface of the vapor deposition mask 100 and the stretching assistance member 50 to each other (ii) in the state of indirect contact of those, a mode of indirectly fixing the vapor deposition mask 100 and the stretching assistance member 50 to each other using a predetermined member can be cited. As the predetermined member, for example, an adhesive agent, an adhesive sheet, a material having magnetism and a material having self-adsorption and repeelability which are exemplarily presented as the aforementioned materials of the stretching assistance member 50 can be cited. The predetermined member may be a member for indirectly joining the vapor deposition mask and the stretching assistance member 50 to each other, in other words, one that does not constitute the stretching assistance member 50, and can be used as a stretching assistance member body part 50A mentioned later (refer to stretching assistance member body parts 50A in FIGS. 19(a) to 19(d) and 19(f)). In the latter case, the predetermined member constitutes the stretching assistance member body part 50A and the stretching assistance member 50 described here constitutes a stretching assistance member extension part 50B. The predetermined member is preferably constituted of a material having a small coefficient of extension in the occasion when the stretching assistance member 50 is pulled. More specifically, it is preferable that the material of the predetermined member which indirectly joins the vapor deposition mask and the stretching assistance member 50 to each other have a smaller coefficient of extension than the material constituting the resin mask 10 of the vapor deposition mask 100. To indirectly fix the vapor deposition mask and the stretching assistance member 50 to each other with such a member can suppress the predetermined member from extending when the stretching assistance members are pulled, which enables the vapor deposition mask to be stretched more precisely. Notably, in the case where the material of the predetermined member has the same coefficient of extension as that of the material constituting the resin mask 10, or is a material having a larger coefficient of extension than the same, as compared with the case where a material having a small coefficient of extension is used as the material of the predetermined member, precision in the occasion when the vapor deposition mask is stretched tends to be lower. Nevertheless, since the predetermined member undergoes expansion and contraction or the like when the stretching assistance members 50 are pulled, the degree of freedom in extension and contraction of the predetermined member can be made larger. When the degree of freedom in extension and contraction of the predetermined member which indirectly joins the vapor deposition mask and the stretching assistance member 50 to each other is made large, external force arising in the case where the vapor deposition mask is fixed to the frame in the state where the vapor deposition mask is being stretched with the stretching assistance members 50 or the similar case can be absorbed by the predetermined member. In other words, the predetermined member can suppress deformation or the like on the vapor deposition mask, positional displacement on the vapor deposition mask, or the similar situation from arising due to the external force. Notably, the coefficient of extension stated here means the coefficient of tensile extension based on JIS K 7127(1999).

Moreover, in the mode (ii), a distance from the surface of the vapor deposition mask 100 to the surface of the stretching assistance member 50 can be secured by an amount of the thickness of the predetermined member, and the stretching assistance member 50 can be suppressed from coming into direct contact with the surface of the vapor deposition mask 100 at a place other than the fixing place where the vapor deposition mask 100 and the stretching assistance member 50 are in indirect contact with each other. For example, in the case where the stretching assistance member 50 and the vapor deposition mask 100 are fixed to each other in the vicinity of the center of one surface of the vapor deposition mask in the aforementioned fixing mode (i), when the stretching assistance member 50 is pulled, the surface of the vapor deposition mask and the stretching assistance member 50 are to come into contact with each other also in a region other than the region where the stretching assistance member 50 and the vapor deposition mask are fixed to each other, that is, a region other than the vicinity of the center, and there can be a case where the surface of the vapor deposition mask is damaged and the similar case depending on the material and the like of the stretching assistance member 50. Specifically, in the case where the surface of the vapor deposition mask fixed to the stretching assistance member 50 is the surface on the resin mask 20 side and the stretching assistance member 50 that is constituted of a metal material or the like which is harder than the material of the resin mask is in contact with the surface of the resin mask in a region other than the fixing place, when the stretching assistance member 50 is pulled, there can be a case where the stretching assistance member 50 damages the surface of the resin mask in other than the fixing place.

Likewise, in the case where a plurality of vapor deposition masks are arranged to line up in the width direction, when one vapor deposition mask fixed to the stretching assistance member is stretched in the width direction of the vapor deposition mask by pulling the relevant stretching assistance member 50 directly fixed to one surface of the one vapor deposition mask of the plurality of vapor deposition masks, the stretching assistance member 50 is also to come into contact with one surface of another vapor deposition mask adjacent to the one vapor deposition mask in the width direction. Depending on the material and the like of the stretching assistance member 50, when the stretching assistance member 50 fixed to the one vapor deposition mask comes into contact with the surface of the other vapor deposition mask, there can be a case where it damages the surface of the other vapor deposition mask or the similar case. Accordingly, when fixation is performed in the aforementioned fixing mode (i), the stretching assistance member 50 that is constituted of a material that does not damage the surface of the vapor deposition mask, such, for example, as resin is preferably used. When the stretching assistance member 50 that is constituted of a material such as resin is used, contact of the stretching assistance member 50 fixed to the one vapor deposition mask with the surface of the other vapor deposition mask does not cause a remarkable problem.

Moreover, when the stretching assistance member 50 that is constituted of a material such as resin is used as the stretching assistance member 50, slippage is given to the stretching assistance member 50. Even when the stretching assistance member 50 fixed to the one vapor deposition mask comes into contact with the surface of the other vapor deposition mask, the stretching assistance member 50 fixed onto the one surface of the one vapor deposition mask can be easily pulled without damaging the surface of the other vapor deposition mask. In an exemplary preferable mode, the stretching assistance member 50 is fixed to the vapor deposition mask 100 in the aforementioned fixing mode (ii) and a stretching assistance member 50 that is constituted of a material having a small coefficient of extension, for example, a metal material is used as the stretching assistance member 50. According to this mode, while suppressing the stretching assistance member 50 from coming into contact with the surface of the vapor deposition mask 100, the stretching assistance member 50 itself can be suppressed from extending when stretching the stretching assistance member 50, which enables the vapor deposition mask fixed to the stretching assistance member to be stretched with more excellent precision. Moreover, even in the case of setting the fixing mode (i), as mentioned later, by bending the stretching assistance member 50 (refer to FIGS. 19(e) and 19(g)), the stretching assistance member 50 can also be suppressed from coming into contact with the surface of the vapor deposition mask 100.

In the above, exemplified by the fixing mode (i) and the fixing mode (ii), preferred embodiments of the stretching assistance member 50 have been described. By configuring the stretching assistance member 50 of the stretching assistance member body part 50A and the stretching assistance member extension part 50B, various problems which can arise in pulling the stretching assistance member 50 can also be suppressed.

The stretching assistance member body part 50A is a stretching assistance member that comes into contact with the surface of the vapor deposition mask 100 and is fixed to the vapor deposition mask 100 in at least part of the stretching assistance member body part 50A and the surface of the vapor deposition mask 100 overlapping with each other, and the stretching assistance member extension part 50B is a stretching assistance member that is joined to the stretching assistance member body part 50A and is not fixed to the surface of the vapor deposition mask 100.

Figures 19A, 19B, 19C, 19D, 19E, 19F, 19G:
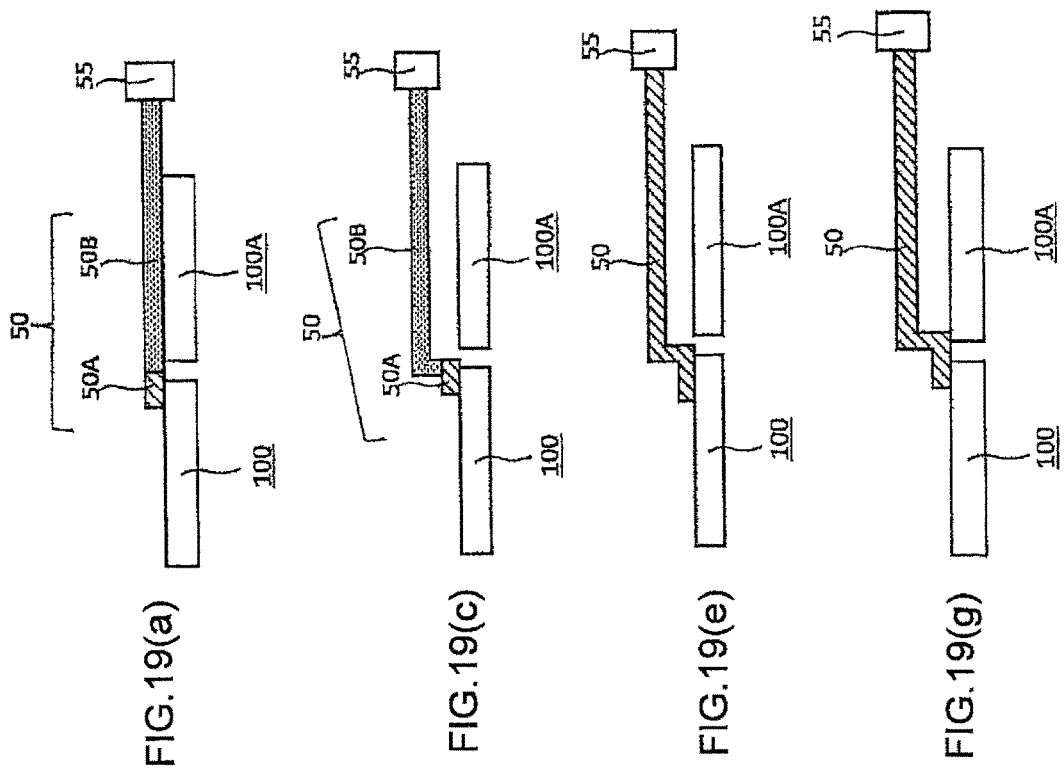
FIGS. 19(a)-19(g) are schematic cross-sectional views showing states where the stretching assistance member is fixed to the vapor deposition mask.

In a stretching assistance member 50 by way of example, the stretching assistance member extension part 50B is constituted of a material hardly damaging the surface of the vapor deposition mask, for example, a material such as resin. FIGS. 19(a) and 19(f) are schematic cross-sectional views exemplarily showing states where the stretching assistance member 50 constituted of the stretching assistance member body part 50A and the stretching assistance member extension part 50B and one vapor deposition mask 100 are fixed to each other in at least part of the stretching assistance member body part 50A and the surface of the vapor deposition mask 100 overlapping with each other. In the modes shown in FIGS. 19(a) and 19(f), to the one vapor deposition mask 100 in the width direction, another vapor deposition mask 100A adjacent to the relevant one vapor deposition mask 100 is positioned, and the stretching assistance member extension part 50B is in contact with the surface of the other vapor deposition mask 100A. In the modes shown in the figures, the stretching assistance member extension part 50B is connected to a driving device 55, and by operating the driving device 55, stretching of the one vapor deposition mask 100 fixed to the stretching assistance member 50 is performed. In the cases of setting the modes shown in FIGS. 19(a) and 19(f), the stretching assistance member extension part 50B is preferable a stretching assistance member extension part 50B constituted of a material hardly damaging the surface of the vapor deposition mask. Using such a stretching assistance member extension part 50B, even in the case where the stretching assistance member extension part 50B and the surface of the other vapor deposition mask 100A come into contact with each other when pulling the stretching assistance member 50, the surface of the other vapor deposition mask 100A can be suppressed from being damaged.

FIGS. 19(b) to 19(d) are schematic cross-sectional views exemplarily showing other examples of the state where the stretching assistance member 50 constituted of the stretching assistance member body part 50A and the stretching assistance member extension part 50B and one vapor deposition mask 100 are fixed to each other in at least part of a portion where the stretching assistance member body part 50A and the surface of the vapor deposition mask 100 overlap with each other. Similarly to FIGS. 19(a) and 19(f), to the one vapor deposition mask 100 in the width direction, another vapor deposition mask 100A adjacent to the relevant one vapor deposition mask 100 is positioned. In the mode shown in FIG. 19(b), the surface of the other vapor deposition mask 100A adjacent to the one vapor deposition mask 100 and the stretching assistance member extension part 50B are not in contact with each other. Moreover, in the modes shown in FIGS. 19(c) and 19(d), the stretching assistance member 50 constituted of the stretching assistance member body part 50A and the stretching assistance member extension part 50B exhibits a step-like shape as its sectional shape as a whole, and the surface of the other vapor deposition mask 100A adjacent to the one vapor deposition mask 100 and the stretching assistance member extension part 50B are not in contact with each other. Therefore, according to the modes shown in FIGS. 19(b) to 19(d), the surface of the other vapor deposition mask 100A can be suppressed from being damaged irrespective of the material of the stretching assistance member extension part 50B. In the case of setting the mode in which the surface of the other vapor deposition mask 100A and the stretching assistance member extension part 50B are not in contact with each other, it is preferable that a material having a small coefficient of extension, for example, a metal material or the like be used as the stretching assistance member extension part 50B. The stretching assistance member extension part 50B that is constituted of a metal material or the like can suppress the stretching assistance member 50 itself from extending in pulling the stretching assistance member 50, which enables the vapor deposition mask to be stretched with more excellent precision.

In the mode shown in FIG. 19(f), the sectional shape of the stretching assistance member extension part 50B is set to be a step-like shape, and the area in which the stretching assistance member extension part 50B and the surface of the adjacent other vapor deposition mask 100A are in contact with each other is made small. According to this mode, the surface of the other vapor deposition mask 100A can be suppressed from being damaged irrespective of the material of the stretching assistance member extension part 50B. Moreover, variation in position of the other vapor deposition mask 100A due to the stretching assistance member 50 and the other vapor deposition mask 100A coming into contact with each other can also be suppressed.

As the material of the stretching assistance member extension part 50B in the case of setting the modes of FIGS. 19(c), 19(d) and 19(f), a material that can be bent and maintain the shape obtained by the bending, for example, a thin plate of metal or the like can be used. As specific examples, a leaf spring, a bracket and the like can be cited.

While in FIGS. 19(a) to 19(d) and 19(f), the thicknesses of the stretching assistance member body part 50A and the stretching assistance member extension part 50B are substantially the same thickness, they may be different thicknesses. Moreover, the width of the stretching assistance member body part 50A may be larger or smaller than or the same as the width of the stretching assistance member extension part 50B (the same width in the modes shown in the figures). Moreover, the shapes of the stretching assistance member body part 50A and the stretching assistance member extension part 50B may be different shapes. For example, in the mode shown in FIG. 19(*a*), the stretching assistance member body part 50A can be set to be sheet-like and the stretching assistance member extension part 50B to be cylindrical, and thereby, while enhancing fixing strength by enlarging the area in which one vapor deposition mask and the stretching assistance member body part 50A are in contact with each other, the area in which another vapor deposition mask 100A adjacent to the one vapor deposition mask 100 and the stretching assistance member extension part 50B are in contact with each other can be reduced, which enables the influence of the stretching assistance member 50 to the other vapor deposition mask 100A adjacent to the one vapor deposition mask 100 to be reduced. The stretching assistance member body part 50A and the vapor deposition mask 100 may be directly fixed or may also be indirectly fixed to each other.

Moreover, as shown in FIGS. 19(*e*) and 19(*g*), the stretching assistance member 50 can also be bent such that the sectional shape is a step-like shape, so that the surface of the other vapor deposition mask 100A adjacent to the one vapor deposition mask 100 and the stretching assistance member 50 are not in contact with each other or the area of their contact is made small. Each of the stretching assistance members 50 shown in FIGS. 19(*e*) and 19(*g*) is in a mode in which one stretching assistance member is bent.

In FIG. 19, relation between one vapor deposition mask 100 in the case where a plurality of vapor deposition masks are arranged in the width direction of the relevant vapor deposition masks, another vapor deposition mask 100A adjacent to the one vapor deposition mask 100, and the stretching assistance member 50 has been described. Also in the case of fixing the stretching assistance member 50 in the vicinity of the center part of the one vapor deposition mask in at least part of a portion that is in contact with the surface of the one vapor deposition mask, the various modes described in FIG. 19 can be properly selected and used. The modes described using FIG. 19 are modes effective in the case where a distance from the position where the stretching assistance member 50 and the vapor deposition mask 100 are fixed to each other to the driving device 55 is long, that is, in the case where the area in which the stretching assistance member 50 and the surface of the vapor deposition mask come into contact with each other is large. Notably, in the case where the distance from the position where the stretching assistance member 50 and the vapor deposition mask 100 are fixed to each other to the driving device 55 is short, that is, in the case where the area in which the surface of the vapor deposition mask and the stretching assistance member come into contact with each other is small, not applying the preferable modes described above, the stretching assistance member 50 and the vapor deposition mask 100 are sufficient to be fixed to each other in at least part of a portion in which the stretching assistance member and one surface of the vapor deposition mask overlap with each other to pull the stretching assistance member.

The fixing position of one surface of the vapor deposition mask 100 and the stretching assistance member 50 to each other is not limited at all but the fixation can be performed at any position. In particular, in an embodiment of the present invention, differently from a gripping device which grips the end part of the vapor deposition mask, the fixation can be performed at any position where the stretching assistance member and the vapor deposition mask overlap with each other, and the vapor deposition mask 100 and the stretching assistance member 50 can be fixed to each other at any position on the surface of the vapor deposition mask.

Moreover, by properly configuring the material of the stretching assistance member, the applying area of an adhesive agent or the like, and the like, the area and the like of a portion in which the stretching assistance member 50 and the vapor deposition mask are fixed to each other can be freely configured. The fixing position is described in detail for the first stretching step mentioned later, showing specific examples.

Notably, in the frame fixing step mentioned later, since the vapor deposition mask is fixed to a frame 60 in the state of being stretched, the fixation of the stretching assistance member 50 and one surface of the vapor deposition mask to each other is preferably fixation at a position where fixation of the vapor deposition mask to the frame is not disturbed. As modes in which the fixation is performed at a position where fixation of the frame and the vapor deposition mask to each other, a mode of fixing the stretching assistance member 50 onto one surface of the vapor deposition mask so as to prevent a scheduled position where the vapor deposition mask and the frame are fixed to each other, and a mode of using a stretching assistance member 50 that does not absorb laser light can be cited.

As the former mode, the modes shown in FIGS. 9(*a*) to 9(*e*) and the similar mode can be cited. In FIGS. 9(*a*) and 9(*b*), one surface of the vapor deposition mask 100 and the stretching assistance members 50 are fixed to each other outside of the fixing scheduled positions to the frame. In FIGS. 9(*c*) to 9(*e*), parts of the stretching assistance members 50 that correspond to the fixing scheduled positions to the frame are removed. Removal of the stretching assistance member 50 may be performed by cutting out the stretching assistance member 50 as shown in FIGS. 9(*c*) and 9(*d*), or may also be performed by boring the stretching assistance member as shown in FIG. 9(*e*). The cutting-out shape or the boring shape for removing a part of the stretching assistance member 50 is not limited to the modes shown in the figures but may be any shape. For example, while in FIG. 9(*e*), the stretching assistance member is circularly bored, the boring may be performed into a polygonal shape or another shape. The same holds true for the cutting-out shape. Moreover, while not shown, also in the case of stretching with a plurality of stretching assistance members 50, a mode in which the stretching assistance members 50 are fixed onto one surface of the vapor deposition mask so as to prevent the fixing scheduled position to the frame can be taken.

Typically, for the fixation of the frame and the vapor deposition mask to each other, a welding fixation method using laser light is used. Accordingly, as the latter mode, also in the case where the stretching assistance member is positioned in a portion overlapping with the scheduled position where the vapor deposition mask and the frame are fixed to each other, by using a stretching assistance member 50 formed using a transparent material, that is, a stretching assistance member 50 that does not absorb laser light, the vapor deposition mask and the frame can be fixed to each other under irradiation with laser light through the stretching assistance member 50. Moreover, since the stretching assistance member 50 formed using a transparent material is used, this mode is a preferable mode in that the vapor deposition mask and the frame can be fixed to each other while seeing the fixing scheduled position to the frame, without disturbing visibility of the scheduled position where the vapor deposition mask and the frame are fixed to each other.

The fixing strength of the vapor deposition mask 100 and the stretching assistance member 50 to each other is not specially limited but is sufficient to be properly configured depending on the tensile force and the like in the occasion of pulling the stretching assistance member 50 in the first stretching step mentioned later. Specifically, the fixation is sufficient to be performed at a strength to an extent where the stretching assistance member 50 does not drop off the vapor deposition mask 100 due to the tensile force in the occasion of pulling the stretching assistance member 50.

<First Stretching Step>

The first stretching step is a step of stretching the vapor deposition mask 100 fixed to the stretching assistance member 50 by pulling the stretching assistance member 50 fixed in the aforementioned stretching assistance member fixing step in at least part of a portion overlapping with the surface of the vapor deposition mask 100. The direction in which the stretching assistance member 50 is pulled is not limited but the pulling may be performed in any direction such as the longitudinal direction of the vapor deposition mask 100 (for example, the crosswise direction shown in FIG. 1), the width direction thereof (for example, the lengthwise direction shown in FIG. 1), and another direction, for example, an oblique direction. In particular, in an embodiment of the present invention, since the stretching assistance member 50 and the vapor deposition mask can be fixed to each other at any position on one surface of the vapor deposition mask, the pulling can be easily performed in a direction other than the longitudinal direction and the width direction of the vapor deposition mask, the pulling in which direction has been difficult with a stretching device using a clamp or the like which grips the end part of a conventional vapor deposition mask. Moreover, to "stretch a vapor deposition mask" stated in the specification of the present application means to pull the stretching assistance member 50 fixed to the vapor deposition mask and to exert external force (tensile force) in a direction in which the vapor deposition mask 100 fixed to the stretching assistance member 50 is extended. In other words, to "stretch a vapor deposition mask" means to exert external force (tensile force) in a direction in which the vapor deposition mask 100 fixed to the stretching assistance member 50 is extended using the stretching assistance member 50. The direction in which the vapor deposition mask is extended stated here is a concept including not only a direction in which the opening 25 provided in the resin mask of the vapor deposition mask is extended but also a direction in which the opening 25 provided in the resin mask of the vapor deposition mask is shrunk. For example, in the modes shown in FIGS. 8(a) and 8(b), by pulling the stretching assistance members 50 outward of the vapor deposition mask 100, the openings (not-shown) provided in one screen of the resin mask of the vapor deposition mask 100 are to be extended in the width direction. On the other hand, in the mode shown in FIG. 8(c), by pulling the stretching assistance members 50 outward of the vapor deposition mask, the openings (not-shown) provided in one screen of the resin mask of the vapor deposition mask 100 are to be shrunk in the width direction. Moreover, as above, since adjustment can be performed not only in the direction of extension but also in the direction of shrinkage, positional adjustment can also be performed in the state where the dimensions of the entirety of the vapor deposition mask, one screen, or the opening in the state of being stretched are maintained. Moreover, by pulling the stretching assistance member 50, almost without changing the dimensions themselves of the opening 25, the positional adjustment of the opening 25 can be performed and distortion, deflection or the like arising in the resin mask 20 can also be relieved.

As long as positioning of the vapor deposition mask can be performed, an angle formed by the surface of the vapor deposition mask 100 and the axis of the direction in which the stretching assistance member is pulled is not specially designated, but in the first stretching step in a preferable mode, the stretching assistance member 50 fixed to the vapor deposition mask is pulled such that the angle formed by the surface of the vapor deposition mask 100 and the axis of the direction in which the stretching assistance member is pulled is in a range of about 0°±89°, preferably about 0°±45°, still preferably about 0°±10°. According to this mode, distortion, deflection or the like can be suppressed from arising in the vapor deposition mask 100 fixed to the stretching assistance member 50 when the stretching assistance member 50 is pulled. In other words, distortion, deflection or the like can be suppressed from arising in the vapor deposition mask after the first stretching step. Notably, the surface of the vapor deposition mask stated here means the surface of the vapor deposition mask corresponding to a region overlapping with the stretching assistance member 50 in plan view of the vapor deposition mask 100.

Moreover, as shown in FIG. 8(b) or the like, in the case where a plurality of stretching assistance members 50 are fixed onto the surface of the vapor deposition mask 100 and the plurality of stretching assistance members 50 are pulled, each stretching assistance member 50 is preferably pulled within a range in which the angle formed by the surface of the vapor deposition mask 100 and the axis of the direction in which the stretching assistance member is pulled is about 0°±89°, preferably about 0°±45°, still preferably about 0°±10°, and is about ±10°, preferably about ±5° with respect to a reference angle. Notably, the reference angle stated here is any angle, for example, when the reference angle is set to be 30°, each stretching assistance member 50 is preferably pulled such that the angle formed by the axis of the direction in which the stretching assistance member 50 is pulled and the surface of the vapor deposition mask becomes about 30°±10°, particularly about 30°±5°. As above, each stretching assistance member 50 is pulled at an angle within the aforementioned preferable range so as to be about ±10°, preferably about ±5°, with respect to the reference angle, and thereby, the vapor deposition mask 100 can be stretched in the state where distortion, deflection or the like of the vapor deposition mask 50 is being suppressed from arising. Notably, in the case where the plurality of stretching assistance members 50 are pulled at random angles without the angle in the occasion when the stretching assistance member 50 is pulled taken into consideration, distortion, deflection or the like tends to easily arise in the vapor deposition mask in the state of being stretched. Moreover, in the case where distortion, deflection or the like arises in the vapor deposition mask fixed to the stretching assistance member 50 in a stage before the first stretching step is performed, it is preferable that with such distortion or deflection taken into consideration, angles at which the individual stretching assistance members are pulled be adjusted to fall within the aforementioned preferable range.

Next, showing specific examples, the first stretching step is described while mentioning the fixing position of the vapor deposition mask 100 and the stretching assistance member 50 to each other.

FIG. 10 presents elevation views showing the first stretching step of an embodiment. In FIG. 10(a), each one of stretching assistance members is fixed to each of the vicinities of opposite two sides of the vapor deposition mask (sides in the width direction in the mode shown in the figure) on one surface of the vapor deposition mask, and by pulling the fixed stretching assistance members 50 outward of the vapor deposition mask (in the directions of the arrows in the figure), the vapor deposition mask fixed to the stretching assistance members 50 is stretched. In FIG. 10(*b*), each one of stretching assistance members 50 is fixed to each of the vicinities of opposite two sides of the vapor deposition mask (sides in the longitudinal direction in the mode shown in the figure) on one surface of the vapor deposition mask, and by pulling the fixed stretching assistance members 50 outward of the vapor deposition mask (in the directions of the arrows in the figure), the vapor deposition mask fixed to the stretching assistance members 50 is stretched. FIG. 10(*c*) presents a mode having those in FIGS. 10(*a*) and 10(*b*) combined. FIGS. 10(*a*) to 10(*c*) present modes in which the vapor deposition mask 100 fixed to the stretching assistance members 50 is stretched using the stretching assistance members 50 in place of conventionally known clamps or the like.

Moreover, in place of the modes shown in FIG. 10, as shown in FIG. 11, a plurality of stretching assistance members 50 may be fixed to the vicinity of the end part of the vapor deposition mask on one surface thereof to stretch the vapor deposition mask 100 fixed to the stretching assistance members 50 using the stretching assistance members 50. According to the modes shown in FIG. 11, since the plurality of stretching assistance members 50 are fixed to the vicinity of the end part of the vapor deposition mask on one surface thereof, the vapor deposition mask can be stretched with more excellent precision. For example, in the modes shown in FIGS. 11(*a*) and 11(*c*), the stretching assistance members 50 are fixed at both the position overlapping with one screen and the position not overlapping with one screen in the width direction of the vapor deposition mask 100 (vertical direction in the figure), and by properly configuring tensile force values or pulling amounts in the occasion when the individual stretching assistance members are pulled, the vapor deposition mask can be stretched with more excellent precision. Notably, in FIG. 11(*a*), a plurality of stretching assistance members 50 are fixed to the vicinities of the end parts of opposite two sides of the vapor deposition mask (sides in the width direction in the mode shown in the figure) on one surface of the vapor deposition mask, and by pulling the stretching assistance members 50 outward of the vapor deposition mask (in the directions of the arrows in the figure), the vapor deposition mask is stretched. In FIG. 11(*b*), a plurality of stretching assistance members 50 are fixed to the vicinities of the end parts of opposite two sides of the vapor deposition mask (sides in the longitudinal direction in the mode shown in the figure) on one surface of the vapor deposition mask, and by pulling the stretching assistance members in the directions of the arrows in the figure, the vapor deposition mask is stretched. FIG. 11(*c*) presents a mode having those in FIGS. 11(*a*) and 11(*b*) combined. Moreover, a mode having the modes shown in FIG. 10 and FIG. 11 properly combined can also be set. FIGS. 20(*a*) and 20(*b*) present modifications of FIG. 11(*a*). In FIG. 20(*a*), the stretching assistance members 50 are fixed at positions overlapping with one screen in the width direction of the vapor deposition mask 100 (vertical direction in the figure). In FIG. 20(*b*), the stretching assistance members 50 are fixed at positions not overlapping with one screen in the width direction of the vapor deposition mask 100 (vertical direction in the figure). The modifications shown in FIG. 20 may be modes having the modes shown in the figures, for example, the mode shown in FIG. 11(*c*) combined. Notably, the modes shown in FIGS. 11(*a*) and 11(*c*) are preferable modes in that variations in the shape and the dimensions arising in the openings 25 constituting one screen can be relieved with excellent precision.

While in the modes shown in FIG. 10 and FIG. 11, each of the stretching assistance members 50 is fixed to each of the vicinities of the end parts of opposite two sides of the vapor deposition mask on one surface of the vapor deposition mask 100, the stretching assistance member may be fixed only to the vicinity of the end part of one side out of the opposite two sides of the vapor deposition mask on the one surface of the vapor deposition mask 100 to stretch the vapor deposition mask. In other words, one side of the opposite two sides may be set as the fixed end to fix the stretching assistance member 50 to the vicinity of the end part of the other side and to pull the relevant stretching assistance member. Moreover, one side of the opposite two sides may be gripped by a gripping device such as a conventionally known clamp to fix the stretching assistance member 50 on the one surface of the vapor deposition mask in the vicinity of the end part of the other side.

The first stretching step using the stretching assistance member 50 may be performed in combination with a gripping device such as a clamp. FIG. 12(*a*) is an elevation view showing a state where the end parts of opposite two sides of the vapor deposition mask 100 (end parts in the longitudinal direction in the mode shown in the figure) are retained by gripping devices 80 such as clamps, and driving devices joined to the gripping devices are operated to stretch the vapor deposition mask in a first direction (longitudinal direction of the vapor deposition mask in the mode shown in the figure). As the driving device joined to the gripping device, a motor, an air cylinder, an electric actuator and the like can be cited. Notably, as shown in FIG. 12(*a*), in the case where the vapor deposition mask 100 is stretched only in the first direction (longitudinal direction of the vapor deposition mask in the mode shown in the figure), there can be a case where distortion or the like arises in the vapor deposition mask due to shrinkage or the like of the vapor deposition mask, and the dimensions and the shape of the openings provided in the resin mask 20 of the vapor deposition mask vary. Notably, FIG. 12(*a*) shows a state where variations in shape and dimensions of the openings (not-shown) arranged in one screen arise due to shrinkage or the like of the vapor deposition mask arising in stretching the vapor deposition mask 100 in the first direction (longitudinal direction of the vapor deposition mask in the mode shown in the figure), and in the mode shown in the figure, the shape of one screen is illustrated as a distorted shape in order to schematically show the variations arising in shape and dimensions of the openings. Notably, the region which is rectangular one screen in FIG. 12(*c*) means that the variations in shape and dimensions of the openings arranged in the one screen are relieved through the first stretching step.

In order to relieve variations in shape and dimensions of the openings which can arise in stretching the vapor deposition mask 100 in the first direction (longitudinal direction of the vapor deposition mask in the mode shown in the figure), in the first stretching step, as shown in FIG. 12(*b*), after the vapor deposition mask is stretched using the gripping devices or the like in the first direction, the stretching assistance members 50 fixed to one surface of the vapor deposition mask 100 are pulled in a second direction different from the first direction (width direction of the vapor deposition mask in the mode shown in the figure). As shown in FIG. 12(*c*), the variations in shape and dimensions of the openings arising due to stretching in the first direction are relieved. To stretch the vapor deposition mask using the stretching assistance member 50 may be performed as above after the vapor deposition mask is stretched in the first direction using the gripping device, or may also be performed while stretching the vapor deposition mask in the first direction using the gripping device. The first direction stated here is not specially limited, but in the case where the vapor deposition mask is stretched using a conventionally known gripping device or the like, the first direction is typically the longitudinal direction or the width direction of the vapor deposition mask 100. Notably, the first direction may be any direction. In other words, the method for producing a frame-equipped vapor deposition mask of an embodiment may include a second stretching step of beforehand stretching the vapor deposition mask using a conventionally known gripping device or the like before the first stretching step is performed or simultaneously to the first stretching step.

Moreover, not using the gripping device such as a clamp, only using the stretching assistance member 50, the aforementioned stretching in the first direction and stretching in the second direction may be performed (refer to FIG. 11(*c*)). Moreover, the stretching in the first direction and the stretching in the second direction using the stretching assistance member 50 may be simultaneously performed, or the stretching in the second direction using the stretching assistance member 50 may be performed after the stretching in the first direction using the stretching assistance member 50.

Figure 15:
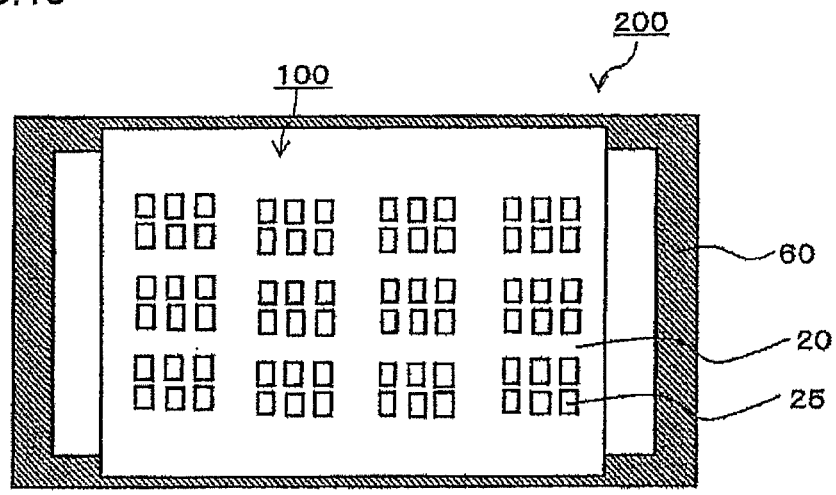
FIG. 15 is an elevation view exemplarily showing a frame-equipped vapor deposition mask.
Figure 16:
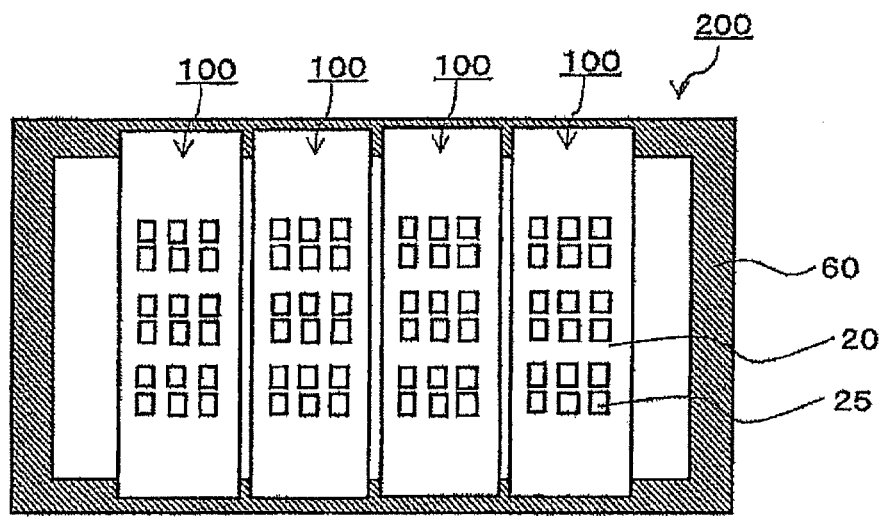
FIG. 16 is an elevation view exemplarily showing a frame-equipped multiple attached vapor deposition mask.

FIG. 15 and FIG. 16 are elevation views exemplarily showing frame-equipped vapor deposition masks of an embodiment of the present invention. A frame-equipped vapor deposition mask 200 shown in FIG. 15 is constituted by fixing one vapor deposition mask 100 to the frame 60. A frame-equipped vapor deposition mask 200 in the mode shown in FIG. 16 is constituted by arranging and fixing a plurality of vapor deposition masks (four vapor deposition masks in the mode shown in the figure) to the frame 60 in the longitudinal direction or the width direction (arranging and fixing them in the width direction in the mode shown in the figure).

Figure 13A:
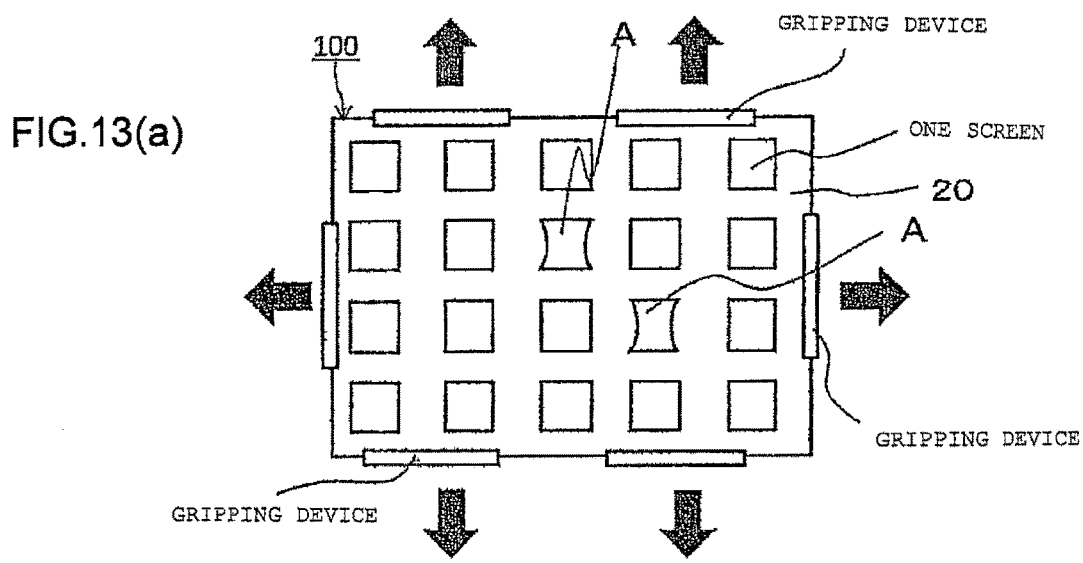
FIGS. 13(a)-13(c) present diagrams for explaining the first stretching step and FIGS. 13(a) to (c) are elevation views of the vapor deposition masks as seen from the resin mask side.
Figure 13B:
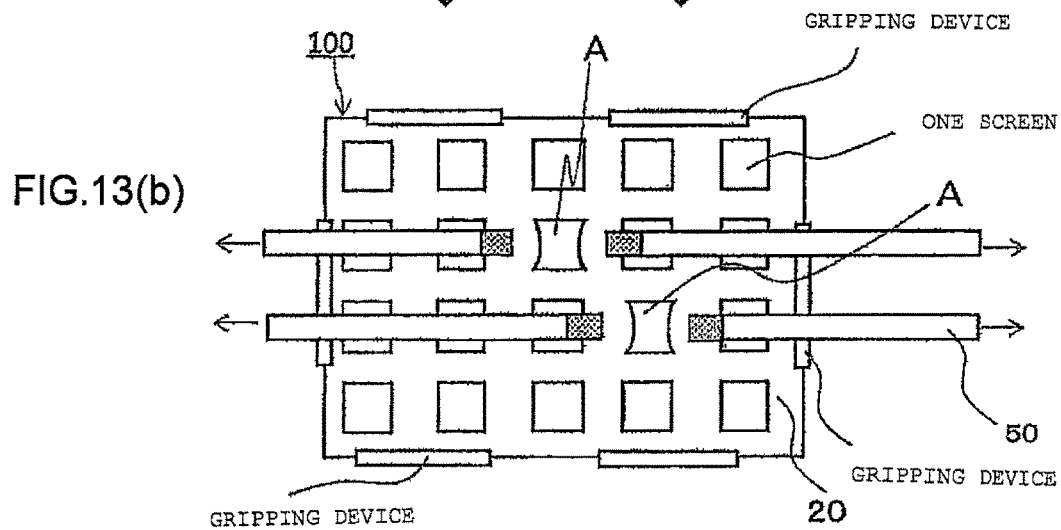
Figure 13C:
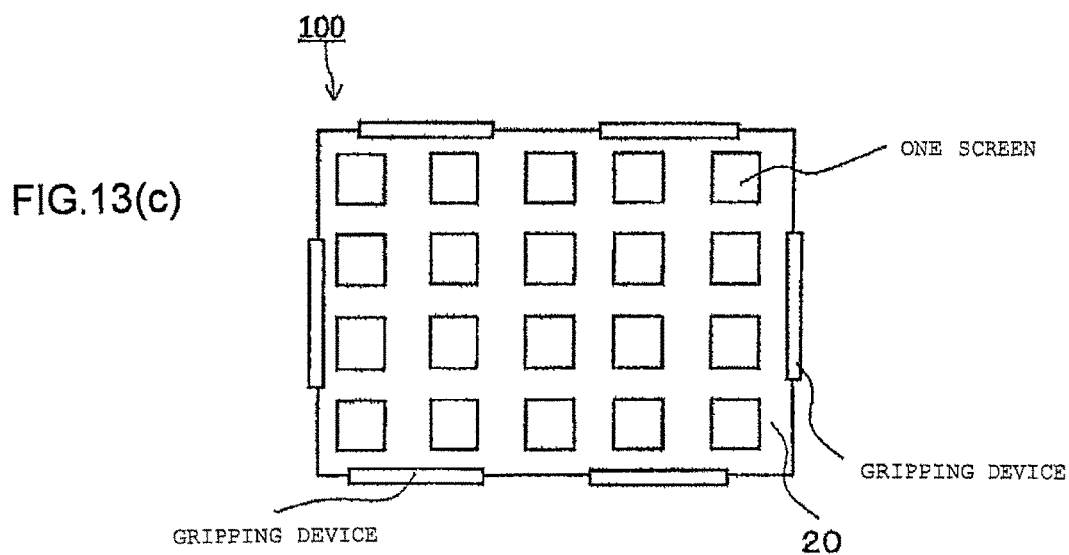

In the frame-equipped vapor deposition mask shown in FIG. 15, since only one vapor deposition mask is fixed to the frame, as shown in FIG. 13(*a*), the end part of the vapor deposition mask in the longitudinal direction and the end part thereof in the width direction can be easily gripped by gripping devices, which enables the vapor deposition mask to be easily stretched in both the longitudinal direction and the width direction. Notably, in FIG. 13(*a*), in partial regions of the vapor deposition mask (each inside of one screen designated by sign A in the figure), variations arise in the shape and the dimensions of the entirety or a part of the openings positioned in the partial regions. In order to relieve such variations in shape and dimensions of the openings, in FIG. 13(*b*), the stretching assistance members 50 are fixed to the vicinity of the region where the variations of the openings arise (between one screen designated by sign A and another one screen adjacent to the one screen designated by the relevant sign A in the mode shown in the figure) on one surface of the vapor deposition mask 100, and by pulling the stretching assistance members 50, the vapor deposition mask fixed to the stretching assistance members 50 is stretched to relieve the variations of the openings. FIG. 13(*a*) is an elevation view exemplarily showing the vapor deposition mask in the occasion when the second stretching step of stretching the vapor deposition mask using gripping devices is performed before the first stretching step. FIG. 13(*b*) is an elevation view of the vapor deposition mask exemplarily showing the state where the stretching assistance member fixing step is performed after the second stretching step. FIG. 13(*c*) is an elevation view exemplarily showing the vapor deposition mask from which variations of the openings are relieved by the first stretching step.

In the mode shown in FIG. 13(*b*), while one surface of the vapor deposition mask 100 and the stretching assistance member are fixed to each other in the entirety or a part of a portion in which a portion between the one screens and the stretching assistance member 50 overlap with each other on the one surface of the vapor deposition mask 100, the one surface of the vapor deposition mask 100 and the stretching assistance member 50 can also be fixed to each other in the entirety or a part of a portion in which the region constituting one screen and the stretching assistance member 50 overlap with each other on the one surface of the vapor deposition mask 100 (not shown). In other words, one surface of the vapor deposition mask 100 and the stretching assistance member 50 can also be fixed to each other within one screen. Specifically, in the vapor deposition masks 100 shown in FIG. 2 to FIG. 7 and the like, one surface of the vapor deposition mask 100 and the stretching assistance member 50 can also be fixed to each other in the entirety or a part of a portion in which a portion between the neighboring openings 25 of the plurality of openings 25 provided in one screen and the stretching assistance member 50 overlap with each other on the surface of the resin mask 20 side. In this case, by stretching the vicinity of the opening 25 provided in one screen, variations in shape and dimensions arising in the relevant opening 25 can be individually relieved. In other words, the fixing position at which one surface of the vapor deposition mask and the stretching assistance member are fixed to each other can be properly configured in accordance with a mode of stretching the entirety of the vapor deposition mask, a mode of stretching the entirety of one screen, a mode of collectively stretching a plurality of openings provided in one screen, a mode of individually stretching the opening 25 provided in one screen, or the similar mode, and the fixing position is not limited at all.

On the other hand, as shown in FIG. 16, in the mode in which a plurality of vapor deposition masks are arranged and fixed to the frame 60 in the longitudinal direction or the width direction of the vapor deposition masks (arranged and fixed thereto in the width direction of the vapor deposition masks in the mode shown in the figure) to afford a frame-equipped vapor deposition mask (hereinafter sometimes referred to as frame-equipped multiple-attached vapor deposition mask), although the end parts of the vapor deposition mask in the longitudinal direction or the width direction (end parts of the vapor deposition mask in the longitudinal direction in the mode shown in the figure) can be easily gripped by gripping devices, the presence of a vapor deposition mask adjacent to one vapor deposition mask makes it difficult that the end parts in the adjacent direction (end parts of the vapor deposition mask in the width direction in the mode shown in the figure) are gripped by gripping devices. In other words, it is difficult to obtain the frame-equipped multiple-attached vapor deposition mask by stretching the vapor deposition mask using gripping devices in both the longitudinal direction and the width direction.

Figure 14A:
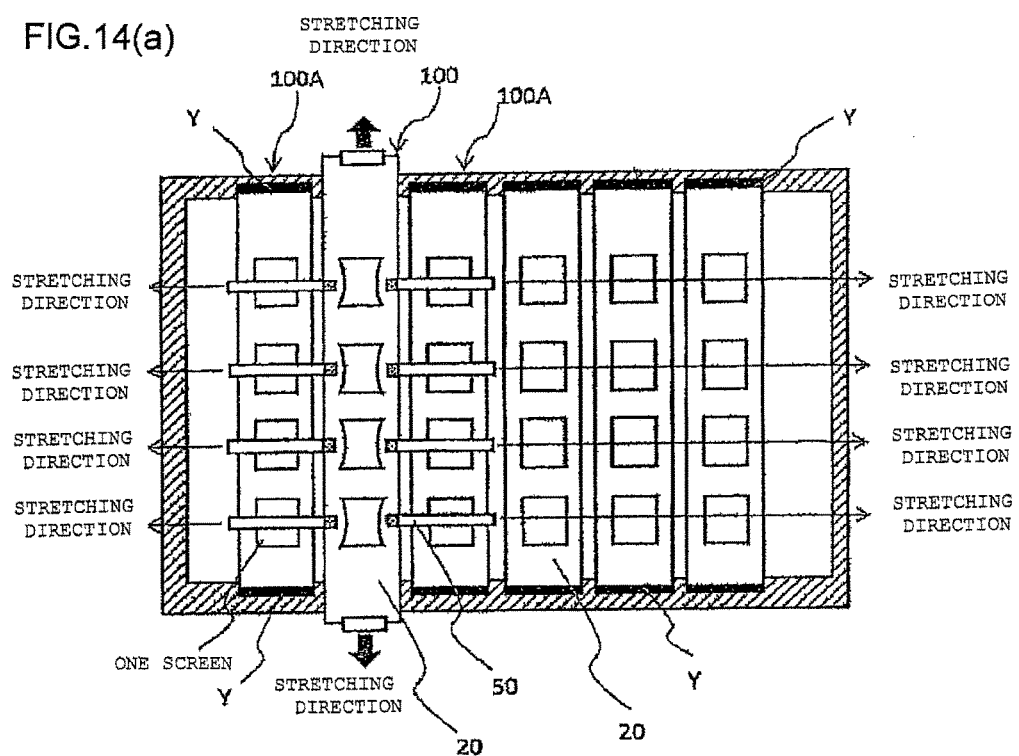
FIGS. 14(a)-14(b) present diagrams for explaining the first stretching step and FIGS. 14(a) and (b) are elevation views of the vapor deposition masks as seen from the resin mask side.
Figure 14B:
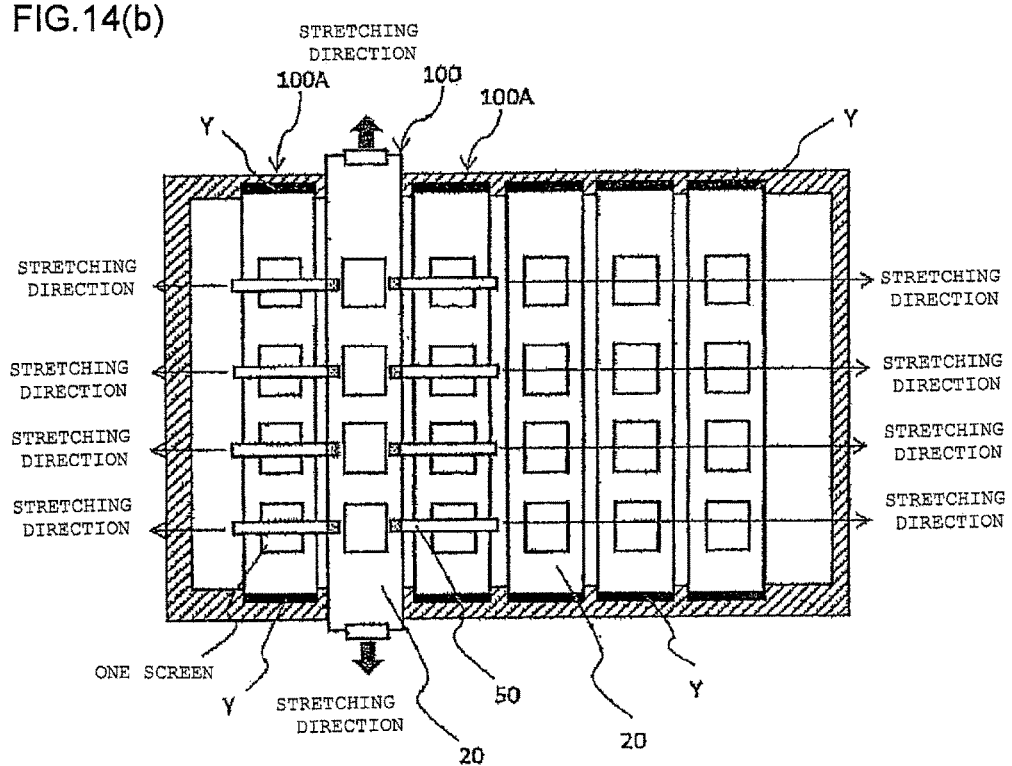

As described above, in the method for producing a frame-equipped vapor deposition mask of an embodiment of the present invention, the stretching assistance member 50 is overlapped on one surface of the vapor deposition mask, the stretching assistance member 50 is fixed to the one surface of the vapor deposition mask in at least part of a portion in which the one surface of the vapor deposition mask and the stretching assistance member 50 overlap with each other, and the vapor deposition mask fixed to the stretching assistance member is stretched by using the stretching assistance member 50, in other words, by pulling the fixed stretching assistance member 50. Accordingly, as illustrated in FIG. 14, even in the case where a gap between one vapor deposition mask 100 and another vapor deposition mask 100A adjacent to the one vapor deposition mask is absent or the gap is small, the stretching assistance member 50 constituted by being fixed to one surface of the one vapor deposition mask can be pulled also in the direction on the side of the adjacent vapor deposition mask, and also in forming the frame-equipped multiple-attached vapor deposition mask, the vapor deposition mask can be stretched on two axes in the longitudinal direction and the width direction thereof. In other words, according to the producing method of an embodiment of the present invention, in the case of setting a frame-equipped multiple-attached vapor deposition mask, the gap between the neighboring vapor deposition masks can be made extremely small. Notably, in the mode shown in the figure, the vapor deposition masks other than the vapor deposition mask 100 are illustrated as being fixed to the frame at the places of signs Y in the figure for convenience of explanation. Moreover, in FIG. 14(*a*), before the first stretching step, the second stretching step of stretching the vapor deposition mask 100 in the first direction (longitudinal direction of the vapor deposition mask in the mode shown in the figure) using gripping devices is performed, and due to the second stretching step, variations in shape and dimensions arise in the openings constituting one screen of the vapor deposition mask 100. By pulling the stretching assistance members 50 in the second direction (on the neighboring vapor deposition masks direction side (in the width direction of the vapor deposition mask) in the mode shown in the figure) in the first stretching step, as shown in FIG. 14(*b*), the variations in shape and dimensions arising in the openings are to be relieved. Notably, the neighboring vapor deposition masks direction is not limited to the direction perpendicular to the aforementioned first direction but may have a certain angle, for example, an angle of about 0°±45°, about 0°±30° or about 0°±5° with respect to the axis of the relevant perpendicular direction.

<Frame Fixing Step>

As shown in FIG. 15 and FIG. 16, the frame fixing step is a step of performing overlapping with the frame 60 in which a through hole is formed such that the frame portion of the frame 60 and the metal mask 10 of the vapor deposition mask which is in the state of being stretched in the aforementioned first stretching step oppose each other, and fixing the vapor deposition mask 100 in the state of being stretched in the aforementioned first stretching step to the frame 60. The fixation of the frame 60 and the vapor deposition mask 100 to each other is performed with respect to a position where the frame 60 and the metal portion of the vapor deposition mask come into contact with each other, and the position is not specially limited. FIG. 15 is an elevation view of the frame-equipped vapor deposition mask in which one vapor deposition mask is fixed to the frame 60 as seen from the resin mask side. FIG. 16 is an elevation view of the frame-equipped multiple-attached vapor deposition mask 200 in which a plurality of vapor deposition masks 100 are arranged and fixed to the frame in the longitudinal direction or the width direction (arranged and fixed thereto in the width direction in the mode shown in the figure) as seen from the resin mask side.

(Frame)

The frame 60 is a substantially rectangular frame member and includes a through hole for exposing the openings 25 provided in the resin mask 20 of the vapor deposition mask 100 fixed in the final stage to the vapor deposition source side. The material of the frame is not specially limited but a metal material large in rigidity, for example, a SUS or invar material or a ceramic material or the like can be used. Above all, a metal frame is preferable in view of being able to easily perform welding to the metal mask of the vapor deposition mask and being small in influence of deformation and the like. The same holds true for the material of a reinforcement frame 65 below.

The thickness of the frame is not specially limited but is preferably about 10 mm to 30 mm in view of rigidity and the like. The widths of the inner circumferential end face of the opening of the frame and the outer circumferential end face of the frame are not specially limited as long as they are widths with which the frame and the metal mask of the vapor deposition mask can be fixed to each other, but, for example, widths of about 10 mm to 200 mm can be exemplarily cited.

Figure 17A:
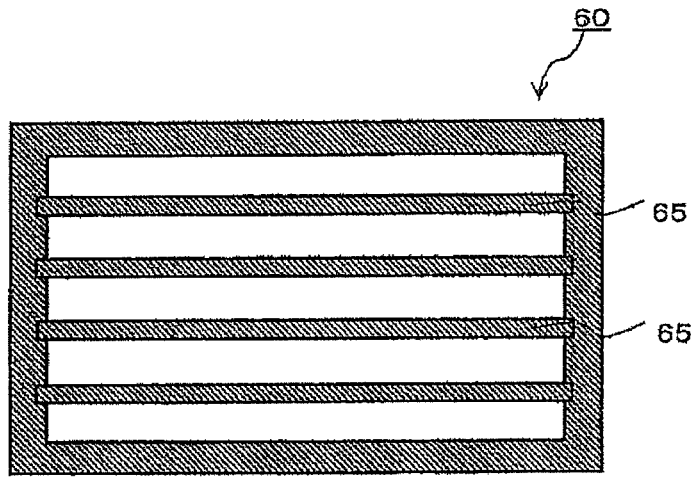
FIGS. 17(a)-17(c) are elevation views exemplarily showing frames.
Figure 17B:
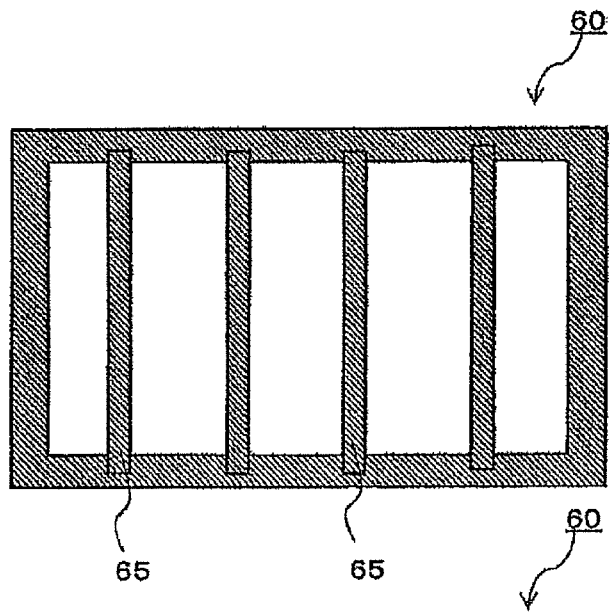

Moreover, as shown in FIGS. 17(*a*) to 17(*c*), the frame 60 in which reinforcement frames 65 and the like are provided in the region of the through hole may be used so as not to disturb exposure of the openings 25 of the resin mask 20 constituting the vapor deposition mask 100. To provide the reinforcement frames 65 enables the frame 60 and the vapor deposition mask 100 to be fixed to each other using the relevant reinforcement frames 65. The frame 60 and the reinforcement frame 65 may be constituted of the same material or may also be constituted of different materials.

Hereafter, the fixing method using the reinforcement frame 65 is exemplarily described.

For example, in the case where the frame-equipped vapor deposition mask in the mode shown in FIG. 16 is formed through the first stretching step described above, it is needed to fix the vapor deposition mask in the state of being stretched after simultaneously performing stretching in the first direction and in the second direction. This is because in the case where the vapor deposition mask being stretched in the first direction is fixed to the frame 60 after stretching in the first direction (for example, in the longitudinal direction of the vapor deposition mask) and before stretching in the second direction different from the first direction (for example, in the width direction of the vapor deposition mask), the frame 60 and the vapor deposition mask 100 are completely fixed to each other in this stage, and even in the case of stretching in the second direction different from the first direction in order to relieve variations in shape and dimensions of the openings which can arise due to stretching in the first direction, the vapor deposition mask 100 cannot be fixed to the frame 60 with the state of being stretched in the second direction maintained.

On the other hand, in the case where the frame 60 in which the reinforcement frames 65 are provided is used, even after the vapor deposition mask is stretched in the first direction (for example, in the longitudinal direction of the vapor deposition mask) and the vapor deposition mask 100 thus being stretched in the first direction is fixed to the body part of the frame 60, using the reinforcement frames 65, the frame 60 and the vapor deposition mask 100 can be fixed again to each other (refer to FIG. 18). Specifically, even after stretching in the second direction different from the first direction in the first stretching step described above after stretching in the first direction is performed with respect to a part or the entirety of the plurality of vapor deposition masks using a predetermined method and the vapor deposition mask 100 is fixed to the body part of the frame 60, the vapor deposition mask in the state of being stretched in the first stretching step can be fixed using the reinforcement frames 65. In other words, using the frame having reinforcement frames, once after the frame-equipped vapor deposition mask constituted by fixing the vapor deposition mask to the body part of the frame 60 is obtained, the stretching assistance members 50 are fixed in the vicinity of a region in which variations in shape and dimensions of the openings arise, the stretching assistance members 50 are pulled, and thereby, the vapor deposition mask having been stretched can be fixed using the reinforcement frames 65. In other words, the vapor deposition mask from which the variations in shape and dimensions of the openings are relieved can be fixed using the reinforcement frames 65. In this method, the aforementioned stretching assistance member fixing step or first stretching step can also be applied as a method of fine adjustment of variations of the openings which can arise after the frame-equipped vapor deposition mask is obtained. The fine adjustment of variations of the openings may be performed by stretching in the direction of expanding the openings 25 or may also be performed by stretching and contraction of the openings 25. Notably, the body part of the frame stated here means a portion different from the reinforcement frames 65, that is, the outer frame.

In the above, while the vapor deposition mask 100 is fixed to the body part of the frame 60 in the state where the vapor deposition mask 100 is being stretched in the first direction, and next, the fixed vapor deposition mask is further stretched in the second direction different from the first direction using the first stretching step described above to fix the vapor deposition mask 100 to the reinforcement frames 65 of the frame 60, in place of this mode, the vapor deposition mask may be first stretched using the first stretching step described above to fix the vapor deposition mask 100 to the reinforcement frames 65 of the frame 60, and next, the vapor deposition mask may be fixed to the body part of the frame 60 by stretching the vapor deposition mask fixed to the reinforcement frames 65 in a different direction from the direction of the previous stretching. Moreover, after stretching in the first direction and in the second direction, the vapor deposition mask may be fixed to the body part of the frame 60 and the reinforcement frames 65.

Stretching in the first direction and stretching in the second direction may be performed in the first stretching step or stretching in any one of those may also be performed in the first stretching step. For example, stretching in the first direction may be performed in the second stretching step using the aforementioned gripping devices or the like and stretching in the second direction may be performed in the aforementioned first stretching step. Moreover, stretching in the first direction may be performed in the aforementioned first stretching step and stretching in the second direction may be performed in the second stretching step. By way of example, the vapor deposition mask is stretched in the first direction in the second stretching step using the aforementioned gripping devices or the like in the stage before performing the first stretching step, and after the second stretching step, the stretching assistance members are pulled in the first stretching step, and thereby, the vapor deposition mask fixed to the stretching assistance members is stretched in the second direction. Moreover, by way of another example, stretching in the first direction by the second stretching step using the gripping devices or the like and stretching in the second direction by the first stretching step are simultaneously performed.

Figure 17C:
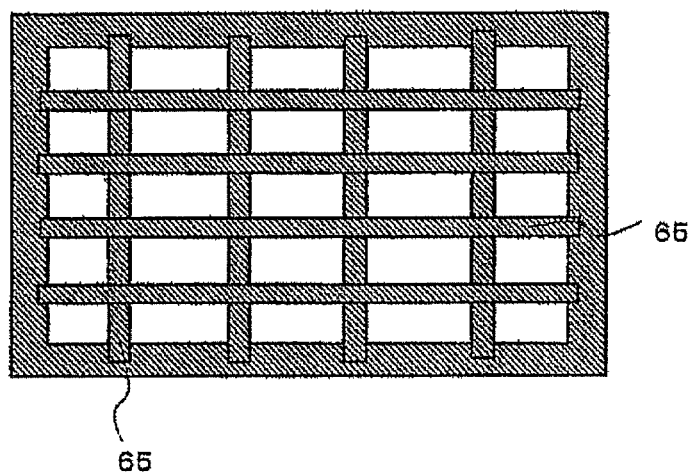

The frame 60 in which the reinforcement frames 65 are provided may be obtained, for example, by integrally forming the body part of the frame 60 and the reinforcement frames 65 of the frame 60 or may also be obtained by fixing the reinforcement frames 65 to the frame that has only the body part. Moreover, the reinforcement frame 65 in a grid shape as shown in FIG. 17(c) may be, for example, an integrated one obtained by processing a metal plate or the like or may also be one obtained by incorporation of a plurality of reinforcement frames 65 in the lengthwise direction and in the crosswise direction. In the latter case, the incorporation is preferably performed such that when a plurality of vapor deposition masks are arranged and disposed in the width direction of the frame 60 (crosswise direction in FIG. 17(c)), the reinforcement frames 65 extending in the direction (lengthwise direction in the figure) perpendicular to the direction of the neighboring vapor deposition masks (crosswise direction in the figure) come into contact with the vapor deposition masks, in other words, such that the reinforcement frames 65 extending in the direction perpendicular to the direction of the neighboring vapor deposition masks are positioned on the upper side. Notably, in FIG. 17(c), the incorporation is performed such that the reinforcement frames extending in the direction of the neighboring vapor deposition masks are positioned on the upper side of the reinforcement frames 65 extending in the direction perpendicular to the direction of the neighboring vapor deposition masks. Moreover, the reinforcement frames 65 are not limited to the mode shown in the figure but may be in the mode in which a plurality of reinforcement frames 65 extending in random directions are combined.

Moreover, the aforementioned first stretching step can also be performed in the state where the vapor deposition mask 100 is tentatively fixed to the body part of the frame 60 or the reinforcement frames 65. The tentative fixation can be performed by disposing a member having magnetism such, for example, as a magnetic plate and a magnet sheet on the surface, of the frame 60, on the side that does not come into contact with the vapor deposition mask 100 or the surface, of the vapor deposition mask 100, on the side that does not come into contact with the frame, and causing the vapor deposition mask 100 and the body part of the frame 60 or the reinforcement frames 65 to attract each other. For example, the frame-equipped vapor deposition mask can also be obtained by tentatively fixing the vapor deposition mask in the state of being stretched in the first direction after stretching in the first direction toward the body part of the frame 60 or the reinforcement frames 65, stretching the vapor deposition mask in the state of being tentatively fixed in the first stretching step, and welding and fixing the frame 60 and the vapor deposition mask to each other after the first stretching step. Moreover, in the case where the stretching assistance members 50 constituted of a material having magnetism or the stretching assistance members 50 obtained by combining the material having magnetism and another material, for example, a material having self-adsorption, without using a separate magnetic plate, magnet sheet or the like, using the magnetism of the stretching assistance members 50 themselves, the vapor deposition mask 100 can also be stretched by the stretching assistance members 50 while tentatively fixing the reinforcement frames 65 of the frame 60 and the vapor deposition mask 100 to each other. In other words, the stretching assistance members 50 in this case serve both to tentatively fix the vapor deposition mask and the frame to each other and to stretch the vapor deposition mask. The tentative fixation can suppress positional displacement and the like that can arise due to stretching the vapor deposition mask, which enables the vapor deposition mask to be stretched with more excellent precision. Moreover, in place of the methods exemplarily presented above, the vapor deposition mask in the state of being stretched in the first direction after stretching in the first direction can also be welded and fixed to the body part of the frame 60, next, the vapor deposition mask welded and fixed to the body part of the frame 60 is tentatively fixed to the reinforcement frames 65, and after that, the first stretching step can also be performed with respect to the vapor deposition mask that has undergone the welding and fixation to the body part of the frame 60 and the tentative fixation to the assistance frames 65. Also with this method, the tentative fixation can suppress positional displacement and the like that can arise due to stretching the vapor deposition mask, which enables the vapor deposition mask to be stretched with more excellent precision.

The width of each reinforcement frame 65 in the case of setting the reinforcement frames 65 in a grid shape in the mode shown in FIG. 17(c) is not specially limited but the widths of all of the reinforcement frames 65 may have the same dimension or the width may also be changed for the individual reinforcement frames 65. Notably, in order to increase the number of vapor deposition masks assigned to the frame when the plurality of vapor deposition masks are arranged and disposed, it is needed for the distance between the neighboring vapor deposition masks to be made small. When the distance between the neighboring vapor deposition masks is made small, accordingly to this, it is also needed for the widths of the reinforcement frames 65 extending in the direction perpendicular to the direction of the neighboring vapor deposition masks to be made small. Now, when the width of the reinforcement frame 65 is made small, the rigidity of the reinforcement frame 65 extending in the direction perpendicular to the direction of the neighboring vapor deposition masks decreases and deformation and the like tend to arise when the vapor deposition mask is fixed to the reinforcement frames 65 extending in the direction perpendicular to the direction of the neighboring vapor deposition masks.

With this point taken into consideration, when the width of the reinforcement frame 65 extending in the direction perpendicular to the direction of the neighboring vapor deposition masks is made small, it is preferable that the width of the reinforcement frame 65 extending in the direction of the neighboring vapor deposition masks is made larger than this width. To increase the widths of the reinforcement frames extending in the direction of the neighboring vapor deposition masks can enhance the rigidity of the reinforcement frames 65 as a whole, which can suppress deformation and the like from arising in the reinforcement frames 65 when the vapor deposition mask is fixed to the reinforcement frames 65. In other words, in reinforcement frames in a preferable mode, the width of the reinforcement frame 65 extending in the direction of the neighboring vapor deposition masks is larger than the width of the reinforcement frame 65 extending in the direction perpendicular to the direction of the neighboring vapor deposition masks. By way of example, the width of the reinforcement frame 65 extending in the direction perpendicular to the direction of the neighboring vapor deposition masks is about 0.5 mm to 50 mm, and the width of the reinforcement frame 65 extending in the direction of the neighboring vapor deposition masks is about 0.5 mm to 50 mm. The reinforcement frames 65 in a preferable mode satisfy the relation that the width of the reinforcement frame 65 extending in the direction perpendicular to the direction of the neighboring vapor deposition masks and the width of the reinforcement frame 65 extending in the direction of the neighboring vapor deposition masks are within the ranges of the widths exemplarily presented above, and that the width of the reinforcement frame 65 extending in the direction of the neighboring vapor deposition masks is larger than the width of the reinforcement frame 65 extending in the direction perpendicular to the direction of the neighboring vapor deposition masks. The thickness of the reinforcement frame 65 by way of example is about 0.01 mm to 30 mm.

Moreover, a groove is formed on the body part of the frame that overlaps with the reinforcement frame 65, the reinforcement frame 65 is fitted to the groove, and thereby, a planar position of the body part to the reinforcement frame 60 can be matched. Moreover, in the case of setting the reinforcement frames 65 in a grid shape by incorporation of the plurality of reinforcement frames 65, grooves or the like can also be properly provided on the reinforcement frames 65 such that planar positions of the individual reinforcement frames 65 are the same.

The fixation method is not specially limited but the fixation can be performed using various conventionally known welding methods such as laser welding, arc welding, electric resistance welding and electron beam welding methods, an adhesive agent, screw fastening, and the like.

Then, after the aforementioned frame fixing step is ended, the stretching assistance members 50 fixed onto one surface of the vapor deposition mask 100 are removed from the vapor deposition mask, and thereby, the frame-equipped vapor deposition mask constituted by fixing the vapor deposition mask to the frame is obtained.

<<Method for Stretching Vapor Deposition Mask>>

Next, a method for stretching a vapor deposition mask of an embodiment of the present invention is described. A method for stretching a vapor deposition mask of an embodiment of the present invention including a metal mask in which a slit is formed and a resin mask in which an opening corresponding to a pattern to be produced by vapor deposition is formed at a position overlapping with the slit, the metal mask and the resin mask being stacked, the method including: a stretching assistance member fixing step of overlapping a stretching assistance member on one surface of the vapor deposition mask and fixing the stretching assistance member to the vapor deposition mask in at least part of a portion in which the one surface of the vapor deposition mask and the stretching assistance member overlap with each other; and a first stretching step of stretching the vapor deposition mask fixed to the stretching assistance member by pulling the stretching assistance member fixed to the vapor deposition mask. According to the method for stretching a vapor deposition mask of an embodiment of the present invention, the vapor deposition mask can be stretched in a simple method, and the vapor deposition mask fixed to the stretching assistance members can be stretched in the direction on the side of another vapor deposition mask even in the situation where the other vapor deposition mask is adjacent to the relevant vapor deposition mask.

Moreover, in the method for stretching a vapor deposition mask of an embodiment, the aforementioned first stretching step is performed after beforehand stretching the vapor deposition mask in the first direction, for example, the longitudinal direction or the width direction of the vapor deposition mask using gripping devices or the like, and in the first stretching step, the stretching assistance members are pulled in the second direction different from the aforementioned first direction of the beforehand stretching, for example, the direction perpendicular to the first direction. In other words, before the first stretching step, a second stretching step of stretching the vapor deposition mask in the first direction using gripping devices or the like may be further included. Moreover, the first stretching step and the second stretching step may be simultaneously performed.

To the stretching assistance member fixing step and the first stretching step, the stretching assistance member fixing step and the first stretching step which have been described for the aforementioned frame-equipped vapor deposition mask of an embodiment of the present invention can be applied as they are, and their detailed description is omitted here.

<<Method for Producing Organic Semiconductor Element>>

Next, a method for producing an organic semiconductor element of an embodiment of the present invention is described. A method for producing an organic semiconductor element of an embodiment of the present invention includes a step of forming a vapor deposition pattern in a vapor deposition method using a frame-equipped vapor deposition mask, wherein in a step of producing the organic semiconductor element, the frame-equipped vapor deposition mask of an embodiment produced in the aforementioned producing method of an embodiment of the present invention is used.

The method for producing an organic semiconductor element of an embodiment including the step of forming a vapor deposition pattern in a vapor deposition method using the frame-equipped vapor deposition mask includes an electrode forming step, an organic layer forming step, a counter electrode forming step, a sealing layer forming step and the like in which electrodes are formed on a substrate, and in any of the steps, a vapor deposition pattern is formed on the substrate in a vapor deposition method using the frame-equipped vapor deposition mask. For example, in the case where the vapor deposition method using the frame-equipped vapor deposition mask is applied to each of light-emitting layer forming steps for colors of R, G and B in an organic EL device, vapor deposition patterns are formed for the light-emitting layers for the colors on the substrate. Notably, the method for producing an organic semiconductor element of an embodiment of the present invention is not limited to these steps but can be applied to any steps in conventionally known production of an organic semiconductor element using a vapor deposition method.

The method for producing an organic semiconductor element of an embodiment of the present invention is characterized in that the aforementioned frame-equipped vapor deposition mask used in steps of forming vapor deposition patterns is the frame-equipped vapor deposition mask of an embodiment described above which is produced in the producing method of an embodiment of the present invention.

For the frame-equipped vapor deposition mask, one produced as the frame-equipped vapor deposition mask of an embodiment of the present invention described above can be used as it is, and its detailed description is omitted here. According to the method for producing an organic semiconductor element using the frame-equipped vapor deposition mask as the frame-equipped vapor deposition mask of an embodiment of the present invention described above, since the frame-equipped vapor deposition mask in which variations in shape and dimensions of the openings of the vapor deposition mask are suppressed can be used, an organic semiconductor element having a pattern with high definition can be formed. As organic semiconductor elements produced in the producing method of an embodiment of the present invention, for example, organic layers, light-emitting layers, cathode electrodes and the like of organic EL elements can be cited. In particular, the method for producing an organic semiconductor element of an embodiment of the present invention can be preferably used for production of R, G and B light-emitting layers of organic EL elements which require pattern precision with high definition.

<<Stretching Apparatus>>

Next, a stretching apparatus of an embodiment of the present invention is described. A stretching apparatus of an embodiment of the present invention for stretching a vapor deposition mask including a metal mask in which a slit is formed and a resin mask in which an opening corresponding to a pattern to be produced by vapor deposition is formed at a position overlapping with the slit, the metal mask and the resin mask being stacked, the apparatus including: a stretching assistance member; and a driving device for pulling the stretching assistance member, wherein the stretching assistance member is capable of being fixed in at least part of a portion overlapping with one surface of the vapor deposition mask when overlapped with the one surface of the vapor deposition mask.

As the stretching assistance member and the driving device which constitute the stretching apparatus, the stretching assistance member 50 and the driving device 55 described for the aforementioned method for stretching the frame-equipped vapor deposition mask of an embodiment can be properly selected and used, and their detailed description is omitted here. According to the stretching apparatus of an embodiment of the present invention, the vapor deposition mask can be stretched by overlapping the stretching assistance member on one surface of the vapor deposition mask, fixing the vapor deposition mask and the stretching assistance member to each other in at least part of a portion overlapping with the one surface of the vapor deposition mask, and operating the driving device joined to the stretching assistance member.

An embodiment of the present invention in the various modes described above is particularly preferable in the case where as the vapor deposition mask which is a target of stretching, a vapor deposition mask including a metal mask in which a slit is formed and a resin mask in which an opening corresponding to a pattern to be produced by vapor deposition is formed at a position overlapping with the slit, the metal mask and the resin mask being stacked, is used. This is because variations in dimensions and position of the openings corresponding to a pattern to be produced by vapor deposition tend to arise in the case where a vapor deposition mask obtained by stacking two masks having different properties, in other words, a resin mask and a metal mask is stretched in a predetermined method, for example, of stretching using gripping devices or the like, as compared with the case where a vapor deposition mask constituted only of a metal mask and a vapor deposition mask constituted only of a resin mask are stretched. In an embodiment of the present invention in the various modes, even when variations in dimensions and position of the openings arise, such variations can be easily relieved by stretching the vapor deposition mask using the stretching assistance members 50.

<<Modifications>>

In the method for stretching a vapor deposition mask, the method for producing a frame-equipped vapor deposition mask, the method for producing an organic semiconductor element, and the stretching apparatus of modifications, as the vapor deposition mask which is a target of stretching, vapor deposition masks different from the aforementioned vapor deposition mask including a metal mask in which a slit is formed and a resin mask in which an opening corresponding to a pattern to be produced by vapor deposition is formed at a position overlapping with the slit, the metal mask and the resin mask being stacked, (hereinafter referred to as different vapor deposition mask) are used, and the different vapor deposition masks are stretched using the stretching assistance members 50. As the aforementioned different vapor deposition masks, a vapor deposition mask constituted only of a metal mask constituted of a metal material, a vapor deposition mask constituted only of a resin mask constituted of a resin material, or a vapor deposition mask constituted of a material other than metals and resin materials can be cited. Notably, each of the embodiments in an embodiment of the present invention and the modifications are different only in the vapor deposition mask which is a target of stretching and are the same in the others. Among the vapor deposition masks of the modifications, the stretching method using the stretching assistance members 50 can be preferably used for the vapor deposition mask constituted only of a resin mask constituted of a resin material, as compared with the vapor deposition mask constituted of a metal material, in view of variations in shape and dimensions of the openings corresponding to a pattern to be produced by vapor deposition tending to arise when the vapor deposition mask is stretched using gripping devices or the like. Moreover, also for the vapor deposition mask constituted only of a metal mask having a portion whose thickness is not more than about 20 μm, the stretching method using the stretching assistance members 50 can be preferably used similarly to the aforementioned vapor deposition mask constituted only of a resin mask, in view of variations in shape and dimensions of the openings corresponding to a pattern to be produced by vapor deposition tending to arise when the vapor deposition mask is stretched using gripping devices or the like.

REFERENCE SIGNS LIST

10 Metal mask
15 Slit
20 Resin mask
25 Opening
50 Stretching assistance member
50A Stretching assistance member body part
50B Stretching assistance member extension part
55 Driving device
60 Frame
65 Reinforcement frame
100 Vapor deposition mask
200 Frame-equipped vapor deposition mask

The invention claimed is:

1. A stretching apparatus for stretching a vapor deposition mask, the apparatus comprising:
   a stretching assistance member; and
   a driving device for pulling the stretching assistance member,
   wherein the stretching assistance member is capable of being fixed in at least part of a portion overlapping with one surface of the vapor deposition mask when overlapping with the one surface of the vapor deposition mask.

2. The stretching apparatus according to claim 1, wherein the stretching assistance member is constituted of at least one material selected from the group consisting of resin materials, metal materials, glass materials, ceramic materials and paper materials.

3. The stretching apparatus according to claim 1, wherein the stretching assistance member has a shape selected from the group consisting of sheet, cylindrical, and prismatic.

4. The stretching apparatus according to claim 1, wherein the stretching assistance member and the vapor deposition mask come into direct or indirect contact with each other in plane, on a line or at a point.

5. The stretching apparatus according to claim 1, wherein the driving device is a member selected from the group consisting of motors, air cylinders, and electric actuators.

6. The stretching apparatus according to claim 1, wherein the stretching assistance member is constituted of a material having magnetism, and the stretching assistance member and the vapor deposition mask are fixed to each other in a state of direct contact through magnetic attraction.

7. The stretching apparatus according to claim 1, wherein the stretching assistance member is constituted of a material having a self-adhesion property, and the stretching assistance member and the vapor deposition mask are fixed to each other in a state of direct contact through adhesion.

8. The stretching apparatus according to claim 1, wherein the stretching assistance member is constituted of a material having self-adsorption and repeelability properties, and the stretching assistance member and the vapor deposition mask are removably fixed to each other in a state of direct contact by adsorption.

9. The stretching apparatus according to claim 8, wherein the material having self-adsorption and repeelability properties is a member selected from the group consisting of silicone resin-based materials, polyolefin resin-based materials, polyurethane-based thermoplastic elastomer-based materials, rubber-based materials, and polyvinyl chloride resin-based materials.

10. The stretching apparatus according to claim 1, wherein the stretching assistance member and the vapor deposition mask are fixed to each other by electrostatic adsorption in a state of direct contact.

11. The stretching apparatus according to claim 1, wherein the stretching assistance member is constituted by combining a material having magnetism with a material having self-adsorption and repeelability properties, the material having magnetism being stacked on the material having self-adsorption and repeelability properties, and the stretching assistance member and the vapor deposition mask are fixed to each other in a state of direct contact.

12. The stretching apparatus according to claim 1, wherein the stretching assistance member and the vapor deposition mask are fixed to each other indirectly via another member.

13. The stretching apparatus according to claim 12, wherein the another member is one selected from the group consisting of adhesive agents, adhesive sheets, materials having magnetism, and materials having self-adsorption and repeelability properties.

14. The stretching apparatus according to claim 12, wherein the another member has a smaller coefficient of extension than that of the material constituting the vapor deposition mask.

15. The stretching apparatus according to claim 12, wherein the predetermined member has the same coefficient of extension as, or a larger coefficient of extension than, that of the material constituting the vapor deposition mask.

16. The stretching apparatus according to claim 1, wherein the stretching assistance member comprises:
   a stretching assistance member body part that comes into contact with a surface of the vapor deposition mask and is fixed to the vapor deposition mask; and
   a stretching assistance member extension part that is joined to the stretching assistance member body part and is not fixed to the surface of the vapor deposition mask.

17. The stretching apparatus according to claim 16, wherein the stretching assistance member extension part is constituted of a resin material.

18. The stretching apparatus according to claim 16, wherein the stretching assistance member has a step-like shape as its sectional shape as a whole.

19. The stretching apparatus according to claim 18, wherein the stretching assistance member extension part is constituted of a metal material.

20. The stretching apparatus according to claim 18, wherein the stretching assistance member body part has a sheet-like shape and the stretching assistance member extension part has a cylindrical shape.

* * * * *